(12) United States Patent
Baburske et al.

(10) Patent No.: US 9,064,923 B2
(45) Date of Patent: *Jun. 23, 2015

(54) BIPOLAR SEMICONDUCTOR COMPONENT WITH A FULLY DEPLETABLE CHANNEL ZONE

(71) Applicant: Infineon Technologies Austria AG, Villach (AT)

(72) Inventors: Roman Baburske, Chemnitz (DE); Josef Lutz, Chemnitz (DE); Ralf Siemieniec, Villach (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 13/898,862

(22) Filed: May 21, 2013

(65) Prior Publication Data

US 2013/0320500 A1 Dec. 5, 2013

Related U.S. Application Data

(63) Continuation of application No. 12/894,239, filed on Sep. 30, 2010, now Pat. No. 8,476,712.

(30) Foreign Application Priority Data

Sep. 30, 2009 (DE) .......................... 10 2009 047 808

(51) Int. Cl.
*H01L 29/86* (2006.01)
*H01L 29/73* (2006.01)
*H01L 29/66* (2006.01)
*H01L 29/861* (2006.01)

(52) U.S. Cl.
CPC .......... *H01L 29/73* (2013.01); *H01L 29/66136* (2013.01); *H01L 29/861* (2013.01); *H01L 29/8611* (2013.01); *H01L 2924/0002* (2013.01)

(58) Field of Classification Search
CPC .............. H01L 29/73; H01L 29/66136; H01L 29/8611; H01L 29/861
USPC .......................................... 257/565, 591, 362
See application file for complete search history.

(56) References Cited

U.S. PATENT DOCUMENTS

| | | | | |
|---|---|---|---|---|
| 4,641,174 | A | * | 2/1987 | Baliga ............................ 257/264 |
| 2003/0038335 | A1 | * | 2/2003 | Huang et al. ................... 257/508 |

(Continued)

*Primary Examiner* — Christine Enad
(74) *Attorney, Agent, or Firm* — Murphy, Bilak & Homiller, PLLC

(57) ABSTRACT

A bipolar semiconductor component includes a semiconductor body having first and second substantially parallel main surfaces and at least one load pn junction, a first metallization on the first surface, a second metallization on the second surface, and a current path running in the semiconductor body from the first metallization to the second metallization only through n-doped zones, including between first and second p-doped zones which are in contact with the first metallization and spaced apart from one another by an n-doped channel zone through which the current path runs. A space charge region forms in the semiconductor body between the first and second p-doped zones to fully deplete the n-doped channel zone between the first and second p-doped zones and therefore prevent current flow between the first and second metallizations along the current path when a positive voltage is applied between the second metallization and the first metallization.

20 Claims, 32 Drawing Sheets

(56) References Cited

U.S. PATENT DOCUMENTS

2005/0212075 A1* 9/2005 Neidig .................. 257/502
2007/0126024 A1* 6/2007 Kelberlau .................. 257/173
2008/0001159 A1* 1/2008 Ota et al. .................. 257/77
2010/0127304 A1* 5/2010 Schulze et al. .................. 257/109

* cited by examiner

BIPOLAR SEMICONDUCTOR COMPONENT WITH A FULLY DEPLETABLE CHANNEL ZONE

PRIORITY CLAIM

This application is a Continuation of U.S. application Ser. No. 12/894,239 filed on 30 Sep. 2010, which claims priority from German Patent Application No. 10 2009 047 808.6 filed on 30 Sep. 2009, both of said applications incorporated herein by reference in their entirety.

FIELD OF THE INVENTION

Embodiments of semiconductor structures, in particular diode structures, which both exhibit soft recovery behavior and have a high surge current strength, and production methods therefor, are specified herein.

BACKGROUND

For freewheeling diodes used e.g., in frequency converters for motor control, it is desirable for said diodes to have a so-called soft recovery behavior during turn-off or changeover, that is to say during commutation. By contrast, it is often undesirable for the diodes to have a hard recovery or oscillation behavior of current and/or voltage during turn-off. In order to achieve a soft recovery behavior of the diode, the internal plasma distribution, that is to say the distribution of the concentration of the free charge carriers (electrons and holes), in the diode can be configured such that it is low at the anode side. A reduction of the plasma on the anode side is realized e.g. in Emcon diodes (Emitter Controlled diodes), MPS diodes (Merged PiN Schottky diodes) and CAL diodes (Controlled Axial Lifetime diodes). With the reduction of the plasma on the anode side, however, the anodal emitter efficiency is also reduced.

In the meantime it has been recognized that in a series of applications, in particular in traction technology, a high surge current strength of the components is additionally required. In specific operating states that are unintended but often unavoidable particularly in the event of relatively long operation (e.g. recharging of the intermediate circuit after a short circuit), high overcurrents can arise e.g. in the frequency converter on the input side. For power diodes having a high blocking capability, this means that they should momentarily tolerate very high currents in the forward direction. Moreover, it is typically expected that an electronic component can be switched off from a current amounting to a multiple of the rated current, without being destroyed. Destruction of the diodes by severe local heating, so-called hot spots, should also be prevented during overcurrent conditions. In addition, the switching losses during changeover are intended to be as low as possible.

The plasma concentration reduced on the anode side in the diode structures mentioned above is, however, as mentioned, tantamount to a low anodal emitter efficiency of the anode emitter. This results in a higher voltage drop in the case of overcurrent and thus impairs the surge current strength of the diode.

In order to achieve a high surge current strength, the SPEED concept was developed (Self-adjusting P-Emitter Efficiency Diode). A lightly doped p-type anode zone having a reduced p-emitter efficiency has additionally introduced into it highly doped $p^+$-type zones that inject charge carriers in the case of a high current, which is intended to result in a lower voltage drop in the case of overcurrent. The SPEED diode is intended to have both a soft recovery behavior and a high surge current strength. However, it has been found that SPEED diodes exhibit a distinctly low robustness even under moderate switching conditions.

The reverse recovery behavior thus deteriorates if the $p^+$-type zones are heavily doped. On the other hand, if the $p^+$-type zones are doped less heavily and/or their horizontal area proportion is kept small, the soft recovery behavior can be maintained, but the improvement in the surge current strength is only moderate.

This can constitute a serious problem primarily in the case of very steep commutation, where a dynamic avalanche breakdown can be the consequence, since the lightly p-doped sections of the Speed diode are partly compensated for by the hole current. In addition, the formation of a cathodal depletion zone in which destructive filaments can arise typically occurs more rapidly during turn-off from high currents. All attempts to produce a SPEED diode having simultaneously robust switching behavior have been insufficiently successful heretofore. Therefore, the SPEED concept has not been implemented commercially.

A further variant is the "emitter switched diode". It consists of sequences of a highly doped $p^+$-type zone and a lightly doped p-type zone. The current path to the lightly doped p-type zone is controlled by a MOS channel. In the case of a MOS channel opened by a positive control voltage, the current takes the path via the lightly doped p-type zone. The emitter efficiency is low and the plasma concentration on the anode side is also low. Without a positive voltage at the gate, only the highly $p^+$-doped zone is active, and the emitter efficiency is high. Both a high surge current strength and a soft recovery behavior can be expected in that case. The disadvantage of this structure, however, is the high manufacturing outlay and also the need for active control at the additional electrode. Therefore, hitherto it has likewise not yet been realized commercially.

SUMMARY

In accordance with one embodiment, a bipolar semiconductor component is provided. The bipolar semiconductor component includes a semiconductor body having a load pn junction, a first horizontal surface and a second surface, which runs substantially parallel to the first surface. A first metallization is arranged on the first surface and a second metallization is arranged on the second surface. From the first metallization to the second metallization, at least one current path runs in the semiconductor body only through n-doped zones.

In accordance with a further embodiment, a semiconductor diode having a dynamic anode emitter efficiency is provided. The semiconductor diode includes an anode structure having a plurality of p-doped anode emitter zones that are spaced apart from one another in each case by an n-doped channel zone, wherein the channel zones and the anode emitter zones are in ohmic contact with the anode metallization.

In accordance with a further embodiment, a semiconductor diode having an anode structure and a cathode structure is provided. The anode structure includes an anode metallization and a plurality of mutually spaced apart p-doped anode emitter zones in ohmic contact with the anode metallization. The cathode structure includes a cathode metallization, an n-doped contact region in ohmic contact with the cathode metallization, an n-doped buffer region electrically connected to the cathode metallization via the contact region and has a lower maximum dopant concentration than the contact region, and at least two mutually spaced part p-doped island zones arranged between the contact region and the buffer region.

In accordance with a further embodiment, a bipolar semiconductor component is provided. The bipolar semiconductor component includes a semiconductor body having a first horizontal surface and a second surface, which runs substantially parallel to the first surface. A first metallization is arranged on the first surface and a second metallization is arranged on the second surface. The bipolar semiconductor component further includes an n-doped first semiconductor region in ohmic contact with the second metallization, at least two p-doped second semiconductor regions spaced apart from one another horizontally and which form a load pn junction with the first semiconductor region, and at least one current path which runs in the semiconductor body from the first metallization to the second metallization only through n-doped zones, wherein a first section of the current path runs between two adjacent second semiconductor regions.

In accordance with one embodiment, a method for producing a semiconductor diode is provided. The first step involves providing a semiconductor substrate having a weakly n-doped first semiconductor zone extending as far as a first surface. Acceptor ions are implanted over the whole area from the first surface. A photopatterned mask is produced on the first surface and an etching step is carried out. Donor ions are subsequently implanted through the mask. The mask is removed and a high-temperature step is effected.

In accordance with a further embodiment, a method for producing a semiconductor diode is provided. The first step involves providing a semiconductor substrate having a weakly n-doped first semiconductor zone extending as far as a first surface. Donor ions are implanted over the whole area from the first surface. A photopatterned mask is produced on the first surface and an etching step is carried out. Acceptor ions are subsequently implanted through the mask. The mask is removed and a high-temperature step is effected.

In accordance with a further embodiment, a method for producing a semiconductor diode is provided. The first step involves providing a semiconductor substrate. The semiconductor substrate includes an n-doped first semiconductor zone extending as far as a first surface of the semiconductor substrate. The semiconductor substrate further includes an n-doped contact region extending as far as a second opposite surface and has a higher maximum dopant concentration than the first semiconductor zone. Moreover, the semiconductor substrate includes an n-doped buffer region arranged between the first semiconductor zone and the contact region and has a maximum dopant concentration that is higher than the maximum dopant concentration of the first semiconductor zone and lower than the maximum dopant concentration of the contact region. The semiconductor substrate further includes at least two mutually spaced apart p-doped island zones arranged between the contact region and the buffer region. A plurality of p-doped anode emitter zones that are spaced apart from one another are produced in the semiconductor substrate provided. An anode metallization is produced on the first surface in electrical contact with the anode emitter zones and a cathode metallization is produced on the second surface.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
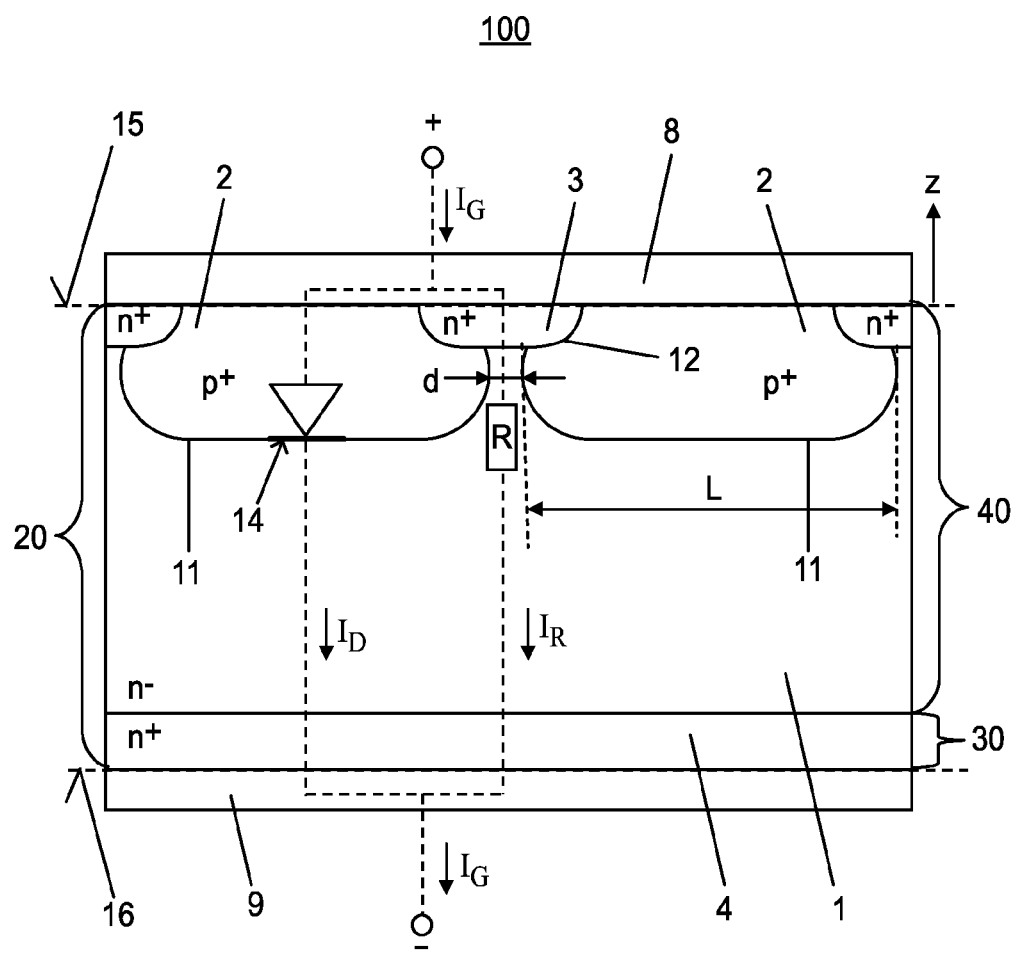
FIG. 1 shows one embodiment of a bipolar semiconductor component.

With regard to the following description it should be taken into consideration that, in the case of the different exemplary embodiments, identical or identically acting functional elements or structures or semiconductor zones have the same reference symbols and the descriptions of these functional elements or structures or semiconductor zones in the different exemplary embodiments illustrated below are mutually interchangeable. The features of the different exemplary embodiments described herein can be combined with one another, unless mention is made specifically to the contrary.

Even though hereinafter a silicon substrate as the semiconductor substrate or a semiconductor body composed of silicon (Si) is often taken as a basis by way of example, it should be pointed out that exemplary embodiments below can also be applied to other semiconductor substrates. Examples of further materials for such semiconductor substrates include, without restriction thereto, elemental semiconductor materials such as, for instance, germanium (Ge), compound semiconductor materials from group IV such as, for instance, silicon carbide (SiC) or silicon-germanium (SiGe), binary, ternary or quaternary III-V semiconductor materials such as, for instance, gallium arsenide (GaAs), gallium phosphide (GaP), indium phosphide (InP), indium gallium phosphide (InGaP) or indium gallium arsenide phosphide (InGaAsP) and binary or ternary II-VI semiconductor materials such as, for instance, cadmium telluride (CdTe) and mercury cadmium telluride (HgCdTe), to name just a few. At the present time, Si and SiC materials are principally used for power semiconductor applications.

Semiconductor components are typically produced by patterning a semiconductor substrate in the form of a semiconductor wafer with, if appropriate, applied epitaxial layers. Such a semiconductor substrate typically comprises a main surface or first surface (e.g. the wafer top side or the outer top side of the topmost epitaxial layer) and a second surface running substantially parallel thereto (e.g. the wafer underside).

The term "horizontal" used in the present description and in the claims is intended to describe an orientation parallel to the main surface of a semiconductor substrate.

The term "vertical" used in the present description and in the claims is intended to describe an orientation arranged perpendicularly to the main surface of the semiconductor substrate.

In the present description, the second surface of a semiconductor substrate is therefore considered to be formed by the lower or rear-side surface, while the first surface is considered to be formed by the upper, front or main surface of the semiconductor substrate. The terms "above" and "below" used in the present description therefore describe a relative location of one structural feature with respect to another structural feature taking account of the orientation defined by the first (upper) and second (lower) surfaces.

In the figures, relative doping concentrations are often indicated by "−" or "+" symbols being appended to the doping type (n or p). By way of example, "n$^-$" denotes a doping concentration that is less than the doping concentration of an "n"-type doping region, while an "n$^+$"-type doping region has a higher doping concentration than the "n"-type doping region. However, the indication of the relative doping concentration does not mean that doping regions of the same relative doping concentration have the same absolute doping concentration, unless mention is made to the contrary. By way of example, two different n$^+$-type regions can have different absolute doping concentrations. The same also applies, for example, to an n$^+$-type region and a p$^+$-type region.

The present description relates to bipolar semiconductor components having a load pn junction, that is to say a pn junction that is a rectifying junction during the operation of the semiconductor component, in particular diodes. This can involve a separate semiconductor component or a semiconductor component into which is integrated a diode e.g. as a freewheeling diode together with other semiconductor structures. In the present description, the forward direction and reverse direction of the load pn junction correspond to the forward direction and reverse direction, respectively, of the semiconductor component, or define these directions.

In the present description and in the claims, the term "depletable region" or "depletable zone" is intended to describe the fact that the corresponding semiconductor region or the corresponding semiconductor zone is substantially fully depleted during the off state of the semiconductor component with an applied reverse voltage lying above a given threshold value. For this purpose, the doping charge of the depletable region is set accordingly and, in one or more embodiments, the depletable region is a weakly doped region. In the off state, the depletable regions form a singly connected zone, also referred to as space charge region, whereby the current flow between two electrodes or metallizations connected to the semiconductor component can be prevented.

FIG. 1 shows, in a vertical section, a first embodiment of a semiconductor component 100 having a semiconductor body 20, on the first surface 15 of which a first metallization or first electrode 8 and on the second surface 16 of which a second metallization or second electrode 9 are arranged, respectively, over the whole area. The direction of the normal to the first surface 15 defines a vertical direction z. The semiconductor body 20 contains an n-doped first semiconductor region or semiconductor layer 1, into which are embedded two p-doped second semiconductor regions 2 that are in ohmic contact with the first metallization 8. An ohmic contact or an ohmic connection is characterized by a symmetrical linear current-voltage curve. In the present description and in the claims, the terms "electrical contact" and "electrical connection" are intended to describe an ohmic contact and an ohmic connection, respectively. In order that the second semiconductor regions 2 can in each case form an ohmic contact with the first metallization 8, either their doping should be chosen to be sufficiently high or a respective, sufficiently highly p-doped additional contact region (not shown) should be arranged between each of the two semiconductor regions 2 and the first metallization 8. In the exemplary embodiment in FIG. 1, the second semiconductor regions 2 are p$^+$-doped and directly adjoin the first metallization 8. The semiconductor body 20 can additionally contain an n-doped fourth semiconductor region or semiconductor layer 4, which produces an ohmic contact between the first semiconductor region 1 and the second metallization 9 and is therefore also referred to hereinafter as n-doped contact region 4. In order to avoid the formation of a Schottky contact between the second metallization 9 and the n-doped contact region 4, its doping should again should be chosen to be sufficiently high. The metallizations 8 and 9 can be genuine metal layers or layers composed of metal alloys or layers or zones composed of materials having metallic electrical conductivity or virtually metallic electrical conductivity such as, for example, tungsten silicide or highly doped polysilicon. The second semiconductor regions 2 form with the first semiconductor region 1 two load pn junctions 11 spaced apart from one another, such that the semiconductor component 100 can be operated as a diode. The first and second metallizations 8, 9 then constitute the anode 8 and the cathode 9, the first semiconductor region 1 constitutes the base region 1, which is also referred to hereinafter as drift region 1, the contact region 4 constitutes the cathode contact region 4, and the second semiconductor regions 2 constitute the p-doped anode emitter zones 2.

Between the anode 8 and the cathode 9 there are current paths which run only through n-doped zones of the semiconductor body 20, such that the total current $I_G$ in the forward direction shown in FIG. 1 is divided into a current fraction $I_D$ running via the load pn junctions 11 and a current fraction $I_R$ running only through n-doped zones. FIG. 1 shows the semiconductor component in a vertical sectional view with two anode emitter zones 2 spaced apart from one another horizontally. In one embodiment, the anode emitter zones 2 are spaced apart from one another in all other vertical sectional views, too, that is to say zones that are separated from one another.

In a further embodiment, however, the anode emitter zone is singly connected and only specific vertical sectional views show two or more anode emitter zones 2 separated from one another. Accordingly, the load pn junction 11, too, can be formed by a singly connected area or consist of a plurality of load pn junctions 11 separated from one another. In other words, the semiconductor component 100 contains at least one load pn junction 11 and at least one current path which leads only through n-doped zones. In the forward direction of the semiconductor component 100, therefore, depending on the total current intensity $I_G$ or applied voltage, there flows in addition to the bipolar current $I_G$ via the load pn junctions 11a unipolar electron current $I_R$, the fraction of which, for a given total current intensity $I_G$ or applied voltage, results from the ratio of the resistance R of the current path running only through n-doped zones to the resistance of the diode current path.

In the exemplary embodiment shown in FIG. 1, the unipolar current path runs from the anode 8, via an n-doped contact zone 3, which adjoins the anode 8 and is arranged between the two anode emitter zones 2 and the drift region 1 or base region 1, the drift region 1, the n-doped contact region 4 to the cathode 9. The contact zone 3 typically extends vertically less deeply into the semiconductor body 20 than the anode emitter zones 2. Therefore, a shallow contact zone 3 is typically involved. The ratio of the vertical extent of the contact zones 3 to the vertical extent of the anode emitter zones 2 can be e.g. in a range of approximately 1:10 to approximately 1:3. Moreover, the contact zone 3 typically forms a respective pn junction 12 with adjacent anode emitter zones 2. In one exemplary embodiment, the doping of the contact zone 3 is high enough to avoid the formation of a Schottky contact between the drift region 1 and the anode 8. By way of example, both the maximum dopant concentration of the n-doped contact region 4 and the maximum dopant concentration of the n-doped contact zones 3 can exceed the value of approximately $10^{19}/cm^3$ (n$^+$-type doping). By contrast, the drift region 1 typically has a maximum dopant concentration suitable for diode operation which is less than $10^{15}/cm^3$ (n$^-$-type doping).

In other words, the anode 8 and the cathode 9 are typically in ohmic contact with one another via the semiconductor body 20 for sufficiently small voltages between anode 8 and cathode 9. The n-doped zones lying in a vertical sectional plane between adjacent anode emitter zones 2 form an n-doped channel through which a unipolar electron current can flow in the forward direction of the semiconductor component 100. Such semiconductor components 100 are also referred to hereinafter as n-channel diodes. At very low voltages, that is to say at voltages below the threshold voltage of the diodes 11 formed by the load pn junctions 11, the current in the forward direction can also flow completely as unipolar electron current. In the present description and in the claims, the term "bipolar semiconductor component" is intended to describe a semiconductor component whose load current, at least at relatively high current intensities, is carried partly by electrons by partly by holes, that is to say at least partly flows via a pn junction.

For reasons of clarity, in FIG. 1 only one of the three unipolar current paths shown and one of the two diode current paths 14 running via a load pn junction 11 have been depicted and designated. FIG. 1, as well as the following figures with vertical cross-sectional views of semiconductor components, typically represent only a portion of these components. Particularly in embodiments as a power semiconductor component, a multiplicity of such structures can be present, that is to say that the second semiconductor regions 2 or anode emitter zones 2 form e.g. a grid. This can be a one-dimensional grid of bar-shaped anode emitter zones 2. In this case, the contact zones 3 typically form a grid offset with respect thereto. However, in a horizontal sectional plane intersecting both the anode emitter zones 2 and the contact zones 3, the anode emitter zones 2 can also be arranged on a two-dimensional grid, e.g. on a square or hexagonal grid. However, it is also possible for the anode emitter zone 2 to be a zone connected in three dimensions and for the contact zones 3 to form a horizontal grid. Furthermore, it is also possible for the channel zones that are each formed from a contact zone 3 and the adjoining depletable zone to be arranged on a grid and to form e.g. circularly or polygonally delimited zones spaced apart from another in horizontal sectional planes in a continuous or large-area anode emitter zone 2.

In accordance with one embodiment, the maximum dopant concentration of the anode emitter zones 2 is higher than approximately $5*10^{18}/cm^3$, that is to say highly doped (p$^+$-doped). By virtue of the associated high emitter efficiency $\gamma=I_H/I_G$ (fraction of the total current $I_G$ constituted by the hole current $I_H$), such a diode has a high overcurrent strength. However, a constantly high emitter efficiency would then lead, primarily in the case of small currents, to a very excessively high stored charge, which must be reduced again during turn-off and can therefore cause a hard recovery behavior, that is to say a non-soft recovery behavior, in particular in the case of fast diodes. If a diode is turned off from the forward direction or switched in the reverse direction, that is to say commutated, the current I as a function of time t firstly reaches a zero crossing and then reaches a maximum. The reverse current then subsides to the blocking current. If this fall is relatively slow and not associated with severe oscillation or snapback, this is referred to as a soft recovery behavior. Generally, the softness of the recovery behavior of diodes can be characterized by the so-called soft factor, which corresponds to the absolute value of the ratio of the commutation speed of the current dI/dt at the zero crossing of the current to the maximum commutation speed of the current after reaching the maximum reverse current. A soft factor of greater than 0.8 is usually required for a soft recovery behavior.

The realization of additional current paths between anode 8 and cathode 9 which run only through n-doped zones reduces the emitter efficiency γ at relatively low current densities and thus permits a soft recovery behavior. Therefore, in diode operation, the bipolar semiconductor component 100 shown in FIG. 1 exhibits both a high overcurrent robustness and a soft recovery behavior during turn-off processes. At lower current densities, the emitter efficiency is reduced by the injection of an electron current. The way in which the emitter efficiency γ changes with the current density can be set by means of the geometry, arrangement and doping ratios of the semiconductor zones. Thus, it is possible to set the unipolar current fraction e.g. by means of the area proportion of the anode emitter zones 2 in a horizontal sectional plane. The area proportion of the anode emitter zones 2 in horizontal sectional planes is typically a maximum of approximately 90% to approximately 98%. In contrast to the "emitter switched diode" mentioned above, however, the control of the emitter efficiency γ does not require an external control and additional electrodes, and this simplifies both production and operation of the semiconductor component 100.

If the area proportion of the anode emitter zones 2 in horizontal sectional planes is relatively low, that is to say approximately 50% to approximately 90%, and the area proportion of the n-channel zones is correspondingly high, then the forward voltage of the n-channel diode 100 can also be less than the customary value for the threshold voltage (in the case of silicon) of 0.7 V. The specified values for the area proportion of the n-channel zones and the anode emitter zones 2 typically relate to that part of the semiconductor component 100 which carries or switches load current; optional edge termination structures are typically not taken into consideration here.

Such an n-channel diode 100 can be used as a power supply system diode e.g. for the input rectifier stages in e.g. PFC stages ("power factor compensation" stages or "power factor correction" stages) of switch-mode power supplies. As a result, a large proportion of the losses of the input rectifier can be avoided and at the same time it is possible to ensure a sufficiently high overcurrent strength, e.g. relative to overvoltages on the power supply system side on account of a flash of lightning or relative to turn-on overvoltages.

For a given $n^-$-type doping of the drift zone 1, the n-doped channel is typically calculated such that, for a given forward voltage of the diode (of e.g. 0.7 V in the case of silicon), the electron current fraction at rated current constitutes e.g. 70%-80% and the emitter efficiency is thus reduced. At high current density, which occurs e.g. under surge current conditions, a fraction of the total current that passes via the n-doped channel is no longer significantly higher than the fraction of the current that results from the resistance R and the junction voltage of the pn junction 11. The fraction of the electron current therefore decreases at high current and the emitter efficiency becomes high at high current.

The bipolar semiconductor component 100 shown in FIG. 1 can therefore be operated as a semiconductor diode 100 having a dynamic anode emitter efficiency, that is to say an anode emitter efficiency controlled in a targeted manner by the load current density, wherein the semiconductor component 100 is an anode structure having a plurality of p-doped anode emitter zones 2 that are in each case spaced apart from one another by one or a plurality of n-doped zones 3, 1 or n-channel zones. The anode structure controls its emitter efficiency in a manner dependent on the current density typically in such a way that said emitter efficiency is low at small current densities and is sufficiently high at large current densities. The extent to which the emitter efficiency increases as the current increases can be controlled, in particular, by means of the horizontal distance between the n-type zones interrupting the p-doped anode emitter zones 2, but to a certain degree also by means of the lateral extent thereof. The bipolar semiconductor component 100 shown in FIG. 1 can be used both as a separate diode and as a diode integrated with other components. Moreover, the p-type emitter structure which is shown and which is self-controlled by n-channels can also be used as an emitter structure in an IGBT or a thyristor.

The minimum horizontal distance d between anode emitter zones 2 that are adjacent, in vertical sections, should be chosen such that it is not excessively large, for example as less than approximately 1 μm or less than approximately 10% of the maximum extent L of the anode emitter zones 2, in order that the electric field cannot punch through in the off-state case and in order that the bipolar semiconductor component 1 can effectively block the current in the reverse direction. This will be explained in greater detail with reference to FIG. 2.

Figure 2:
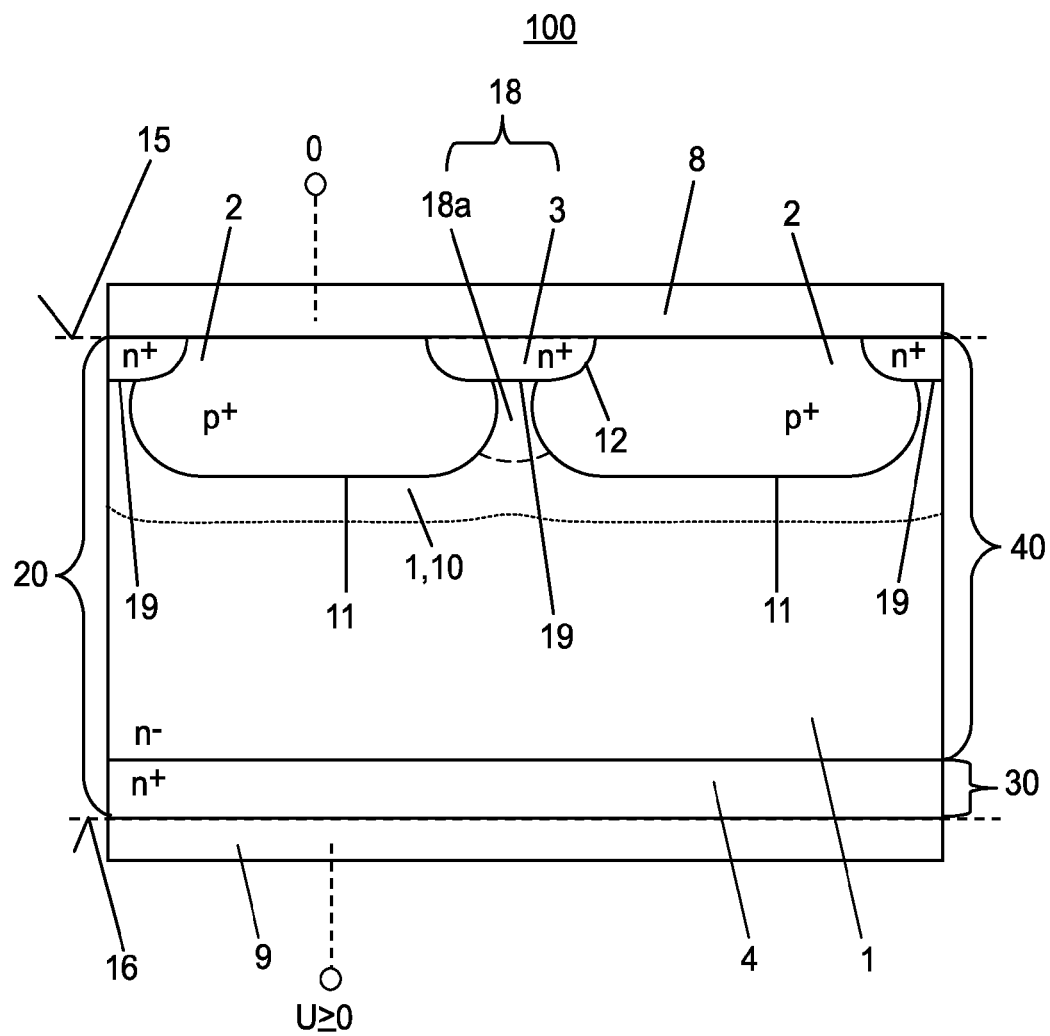
FIG. 2 illustrates the extent of the depletion region (space charge region) of the semiconductor component from FIG. 1 at a relatively low reverse voltage.

FIG. 2 illustrates the blocking behavior of the semiconductor component 100 shown in FIG. 1 at relatively low reverse voltage. Depending on the planned use of the semiconductor component 100, the semiconductor component 100 should block current in the reverse direction up to a positive setpoint voltage $U_s$ between cathode 9 and anode 8. In this case, the setpoint voltage $U_s$ can be in a range of from a few 10 V in the case of low-voltage diodes up to a few thousand volts in the case of high-voltage diodes. The geometry and doping of the semiconductor zones 1-3 are preferably chosen such that in the reverse direction a closed depletion region 10 or space charge region 10 forms between the anode 8 and the cathode 9, and a current flow is thereby prevented. In FIG. 2, the depletion region 10 begins at the dotted line and ends, on account of the significantly higher doping, toward the top directly above the load pn junctions 11 in the anode emitter zones 2 and directly below the $n^-/n^+$ junctions 19 in the contact zones 3. For reasons of clarity, however, the upper limit of the space charge region 10 is not shown in FIG. 2. The depletion region 10 in FIG. 2 corresponds to a relatively low reverse voltage. As the reverse voltage increases, the space charge region 10 expands particularly in the direction of the interface between the cathode contact region 4 and the drift region 1 into the drift region 1. In other words, a respective depletable zone 18a is situated between anode emitter zones 2 that are adjacent in a vertical sectional plane, the depletable zone 18a being a partial zone of the depletion region 10 in the off-state case. The depletable zone 18a and the adjoining contact zone 3 together typically form an n-doped channel region 18 between adjacent anode emitter zones 2.

A first or upper section of the current path through which, as illustrated in FIG. 1, a unipolar electron current $I_R$ flows in the forward direction therefore runs between two horizontally adjacent anode emitter zones 2. The first section typically contains a depletable zone 18a that is delimited horizontally by adjacent anode emitter zones 2.

Figure 3:
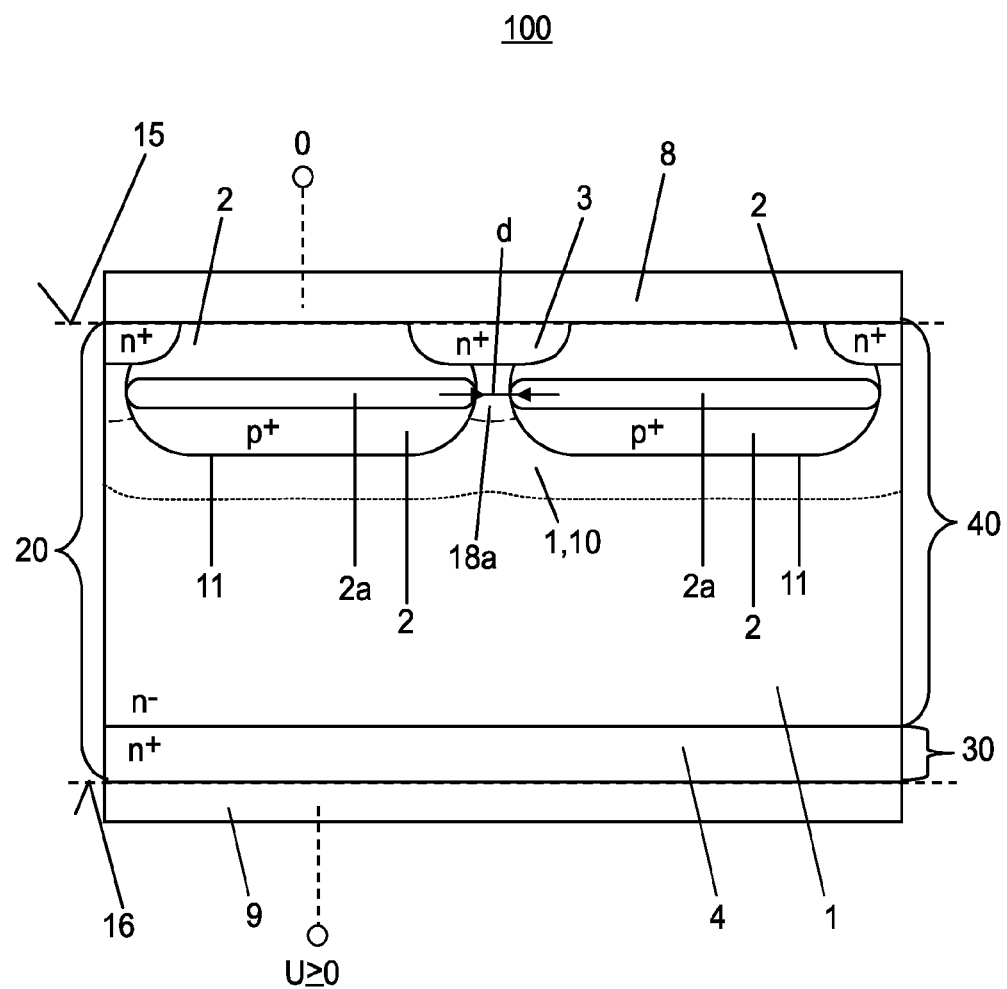
FIG. 3 shows a further embodiment of a bipolar semiconductor component.

FIG. 3 illustrates, in a vertical section, the blocking behavior of a semiconductor component 100 in accordance with an embodiment similar to the embodiment sown in FIG. 1. In contrast to the semiconductor component 100 shown in FIG. 1, the anode emitter zones 2 each contain a continuous subregion 2a, in which the dopant concentration is higher than in the remaining partial zones of the anode emitter zones 2 or higher than in adjoining partial zones of the anode emitter zones 2. The p-doped subregions 2a are situated vertically where the lateral distance d between the anode emitter zones 2 is smallest. As a result, the depletable zone 18a is already depleted at very low positive voltages between cathode 9 and anode 8. The dopant concentration of the anode emitter zones 2 reaches its maximum or a maximum therefore e.g. vertically in the centre of the anode emitter zones 2.

Figure 4:
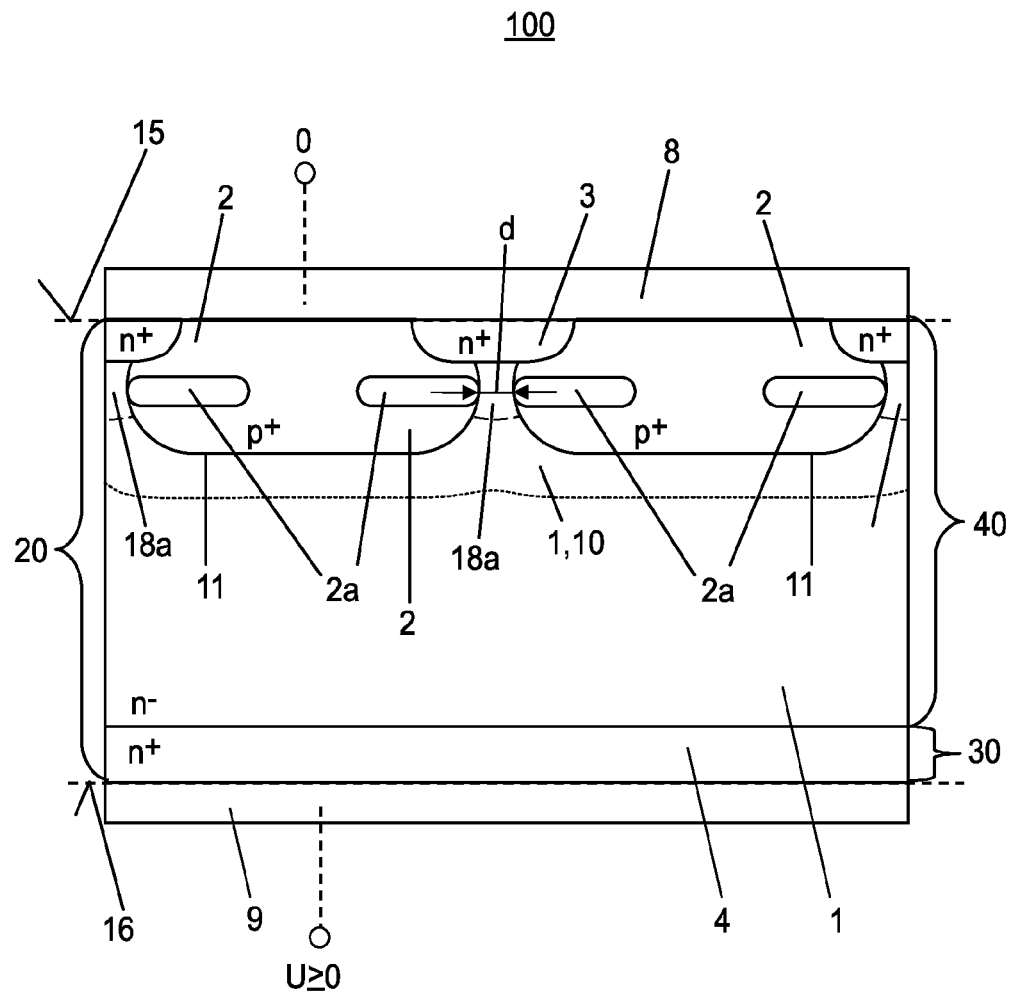
FIG. 4 shows a further embodiment of a bipolar semiconductor component.

FIG. 4 illustrates, in a vertical section, the blocking behavior of a semiconductor component 100 in accordance with an embodiment similar to the embodiment shown in FIG. 3. The anode emitter zones 2 of the bipolar semiconductor component 100 shown in FIG. 4 have, instead of a horizontally continuous subregion 2a, in each case two subregions 2a in which the dopant concentration is higher than in the remaining partial zones of the anode emitter zones 2 or higher than in adjoining partial zones of the anode emitter zones 2. Once again the p-doped subregions 2a are situated vertically where the lateral distance d between the anode emitter zones 2 is smallest, in each case one of the subregions 2a respectively adjoining a depletable region 18a or a depletable zone 18a on the left and on the right, as a result of which the depletable zone 18a, in comparison with the semiconductor component 100 shown in FIG. 1, is again fully depleted at much lower positive voltages between cathode 9 and anode 8. The dopant concentration of the anode emitter zones 2 typically has a maximum in a horizontal plane in which the anode emitter zones 2 have a maximum horizontal extent L (or are at a minimum horizontal distance d from one another). In other words, the dopant concentration of the second semiconductor regions 2 can have, in a vertical direction, a maximum at a vertical depth corresponding to the horizontal plane in which the second semiconductor regions 2 are at a minimum distance d from one another. In addition, an increase in reverse current can be counteracted by a local carrier lifetime reduction in the depletable zone 18*a* of the channel zone 18.

Figure 5:
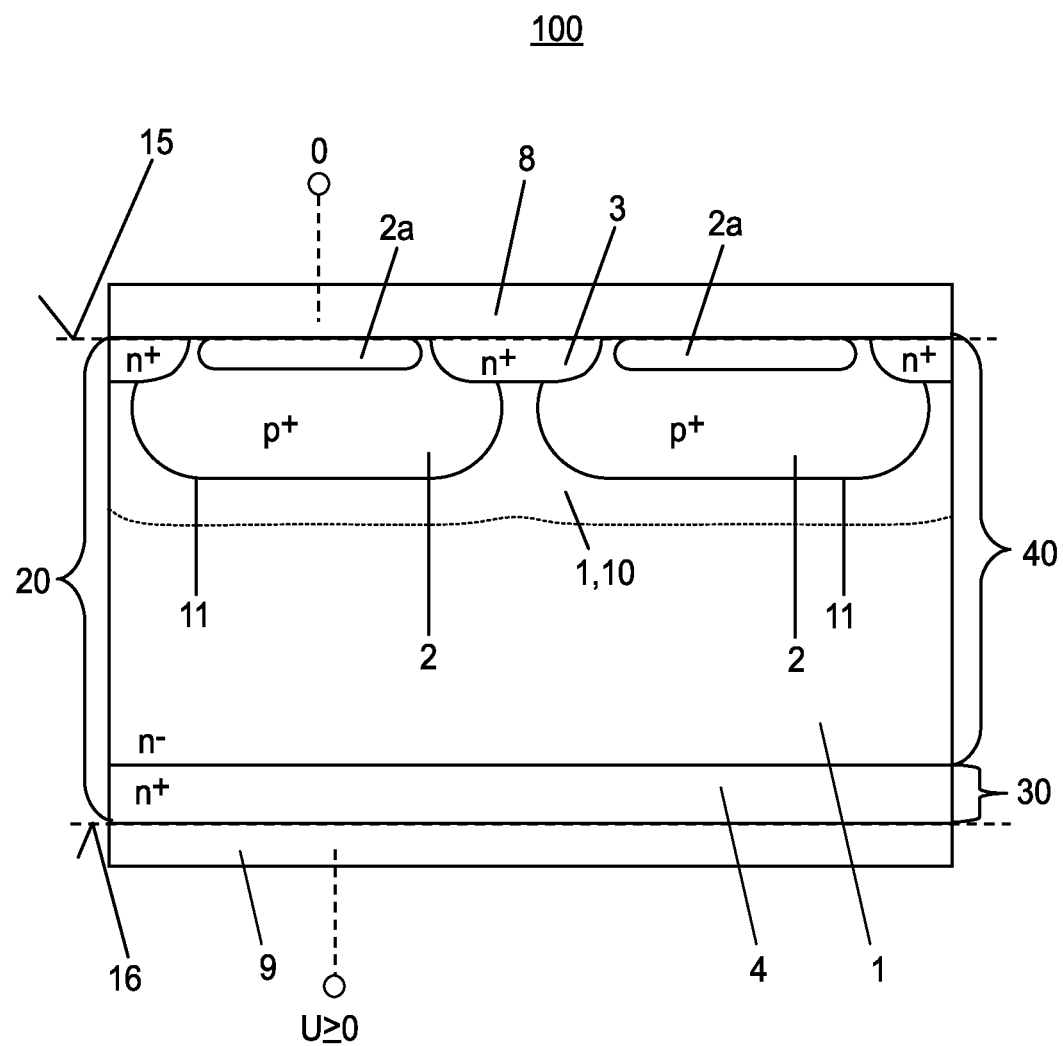
FIG. 5 shows a further embodiment of a bipolar semiconductor component.

A further embodiment of a bipolar semiconductor component 100 will be explained with reference to FIG. 5. As can be seen in the vertical sectional view shown, the p-doped subregions 2*a* having an increased dopant concentration by comparison with the remaining adjoining parts of the anode emitter zones 2 are situated in direct contact with the anode metallization 8. In this case, the dopant concentration of the anode emitter zones 2 typically has a maximum at the anode 8, whereby a particularly good electrical contact can be produced. The embodiments shown in FIGS. 3 and 4, respectively, can be combined with the embodiment shown in FIG. 5, that is to say that the dopant concentration of the anode emitter zones 2 can have a maximum both at the anode 8 and in subregions 2*a* adjoining the depletable zones 18*a*. The subregions 2*a* can be formed by additional implantations, or by choice of the position of the dopant maximum during the implantation for the anode emitter zones 2. In other words, the dopant concentration of the second semiconductor regions 2 can have, in a vertical direction, an absolute or a local maximum at a vertical depth corresponding to the horizontal plane in which the second semiconductor regions 2 are at a minimum distance d from one another.

Figure 6:
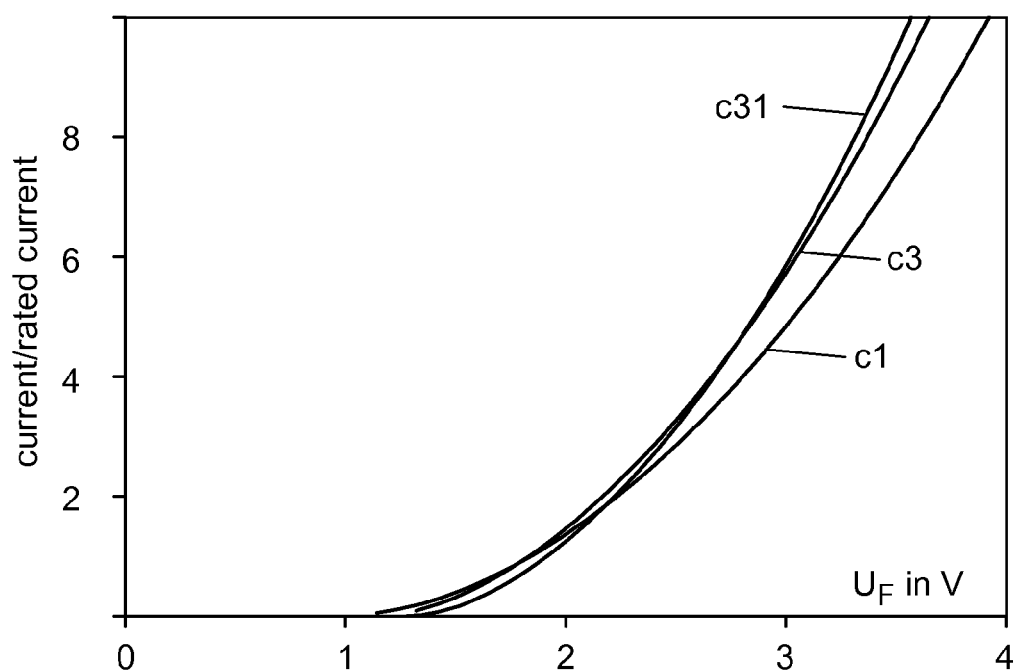
FIG. 6 shows simulated forward characteristic curves of the bipolar semiconductor components shown in FIGS. 3 and 4 in comparison with a reference diode.

FIG. 6 shows forward characteristic curves (relative current as a function of the forward voltage $U_F$) of the bipolar semiconductor components 100 shown in FIGS. 3 and 4 in comparison with a reference diode having a continuous p-type emitter, wherein the curve c1 corresponds to the reference diode having a maximum dopant concentration of $2.4*10^{17}$ cm$^{-3}$ at the anode, the curve c3 corresponds to an n-channel diode having anode emitter zones 2 spaced apart from one another by approximately 1 µm, the dopant concentration of which reaches its maximum of $10^{19}$ cm$^{-3}$ vertically in the center of the anode emitter zones 2 (corresponds to the embodiment shown in FIG. 3), and the curve c31 corresponds to an n-channel diode having anode emitter zones 2 spaced apart from one another by approximately 1 µm, the dopant concentration of which reaches its maximum of $5*10^{18}$ cm$^{-3}$ at the anode metallization 8 (corresponds to the embodiment shown in FIG. 4). As becomes evident from the comparison of curves c1, c3 and c31, the n-channel diodes have a significantly higher surge current strength than the comparative diode since, at currents higher than twice the load current, a significantly smaller voltage is dropped and the component is therefore loaded to a lesser extent. In accordance with further simulations (not shown), n-channel diodes having a minimum distance between adjacent anode emitter zones 2 of approximately 500 nm to approximately 1 µm typically exhibit a significantly higher surge current strength by comparison with the comparative diode.

Figure 7:
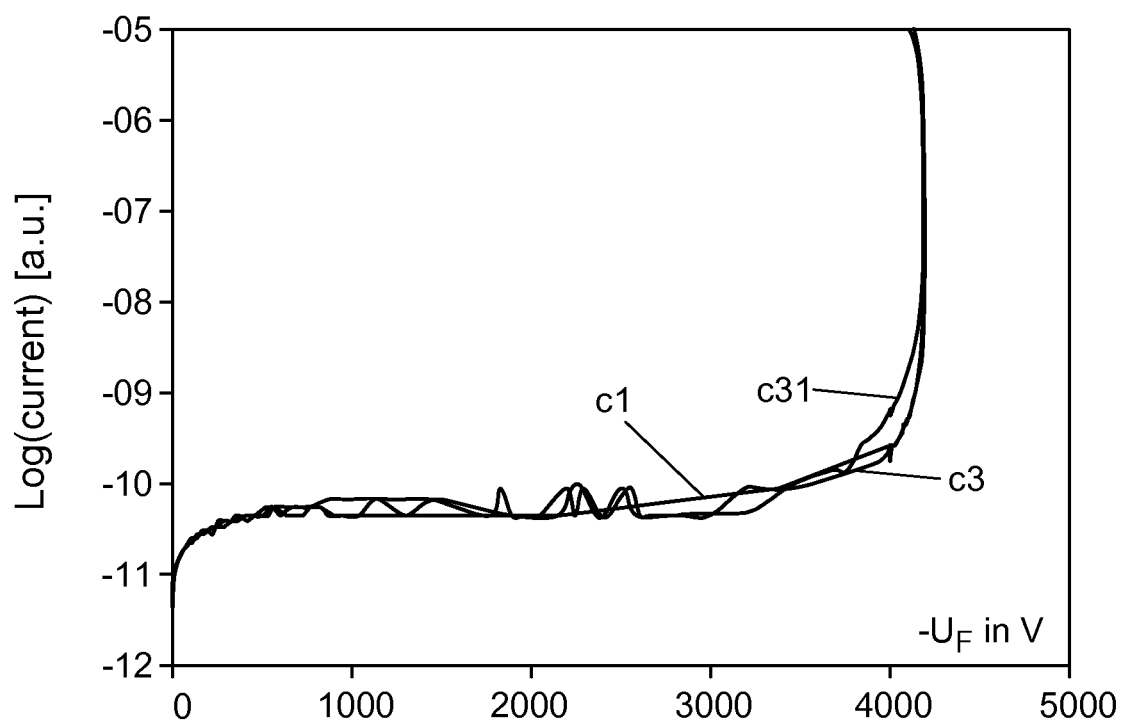
FIG. 7 shows simulated blocking capacities of the bipolar semiconductor components shown in FIGS. 3 and 4 in comparison with a reference diode.

In accordance with the corresponding curves shown in FIG. 7, the blocking capability of the three diodes is comparably good, however. The depletable zones of the n-channel diodes therefore effectively prevent (at least after the reverse current has subsided as a result of a commutation process possibly carried out) a current through the n-doped channel zones in the reverse direction of the diode.

Figure 8:
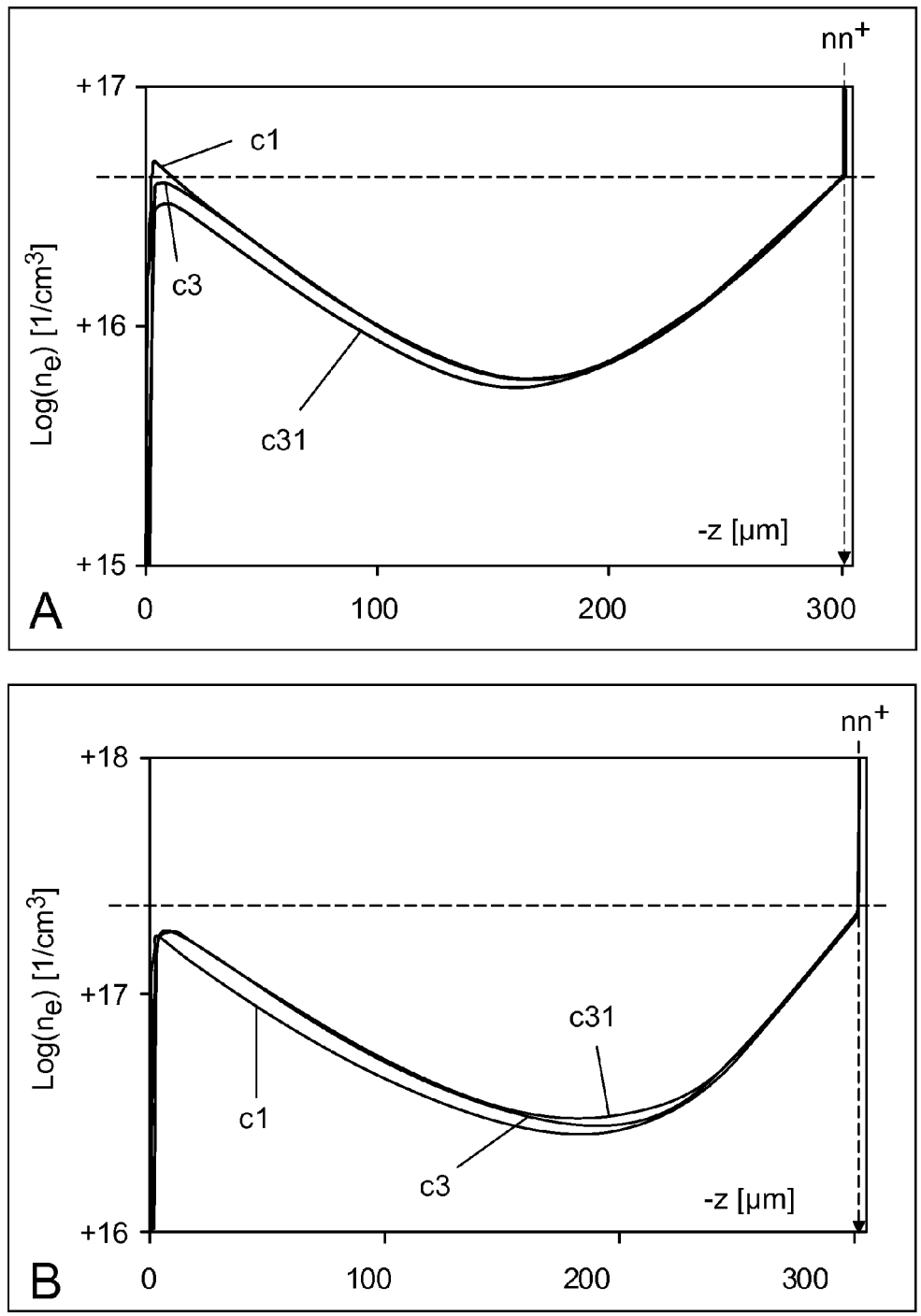
FIG. 8A shows simulated vertical charge carrier distributions of the bipolar semiconductor components shown in FIGS. 3 and 4 in comparison with a reference diode at rated current density.
FIG. 8B shows simulated vertical charge carrier distributions of the bipolar semiconductor components shown in FIGS. 3 and 4 in comparison with a reference diode at 10-fold overcurrent.

FIG. 8 shows, on the basis of the vertical charge carrier distribution (electron concentration $n_e$) in the forward direction of the bipolar semiconductor components 100 shown in FIGS. 3 and 4 in comparison with the reference diode, that the n-channel diodes under consideration here can also be designed as soft recovery diodes, that is to say can also exhibit soft recovery behavior. For this purpose, the charge carrier concentration on the anode side (on the left in FIGS. 8A and 8B) should always be less than that on the cathode side. This state is also striven for in the case of the n-channel diodes (the curve designation corresponds to the designation in FIGS. 5 and 6). If the charge carrier distribution on the anode side is low, this brings about a low reverse current peak and contributes to the desired soft recovery behavior. At the same time, moreover, less stored charge is generated as a result. In the case of the reference diode, however, such a charge carrier distribution results in an increased forward voltage at a current that is a multiple of the rated current. With the additional n-doped channel, however, it is now possible, in contrast to a normal load pn junction (reference diode), to design the remaining p-type zones for a high emitter efficiency and therefore, as can be seen in FIG. 6, nevertheless to obtain a lower forward voltage $U_F$.

The functioning of the n-channel diodes under consideration here is explained below on the basis of a model for the emitter efficiency of the p-type emitter at the anode. For the p-type emitter, the emitter efficiency γ is defined as $$Y = \frac{j_p}{j} \quad (1)$$

where $j_p$ is the current density of the holes and j is the total current density. For a high emitter efficiency (γ→1), therefore, the fraction $j_p$ of j is intended to be as high as possible. It then holds true that j=jn+jp. Equation (1) can thus be transformed to $$Y = \frac{j - j_n}{j} = 1 - \frac{j_n}{j} \quad (2)$$

This means that the fraction of the electron current $j_n$ for a high emitter efficiency has to be correspondingly small. For a soft recovery behavior, γ should, in the range of the rated current, but in particular in the case of small currents, be comparatively small, that is to say lie in a range of approximately 0.4 to approximately 0.6, in order to make the charge carrier profile at the anode side (on the left in FIGS. 8A and 8B) as low as possible. For the following considerations it is assumed in a simplified way that the potential jump at the pn junction is 0.7 V and does not change with the current density, that is to say that the relatively low dependence of the potential jump at the pn junction on the current density is disregarded. At half rated current, the fraction of the electron current ought then to be 40%, for example. At half rated current an emitter efficiency of 0.4 is then present. Pure electron current shall flow via the channel. The resistance R of the current flowing via the n-channel (or of the parallel circuit formed by a plurality of individual channels) results from the doping of the n-doped zones, their depth and lateral extent. The resistance R is chosen such that, at half rated current and 0.7 V voltage in the forward direction, 40% of the total current flows via the n-channel. The current via the channel then remains constant, even if the total current is increased. γ is thus 0.8 at rated current, 0.9 at twice the rated current and 0.98 at 10-fold rated current. In the case of emitters designed for high efficiency, although at high current effects such as Auger recombination and further effects reduce the emitter efficiency, this does not change anything about the fact that the emitter efficiency of the n-channel diode corresponds to 0.98 times that of a normal pn diode with a very strong emitter.

It will now be shown below that the recovery behavior can be improved further by additional cathodal structuring of the semiconductor body particularly under very hard switching conditions, that is to say high commutation speeds of the current.

Figure 9:
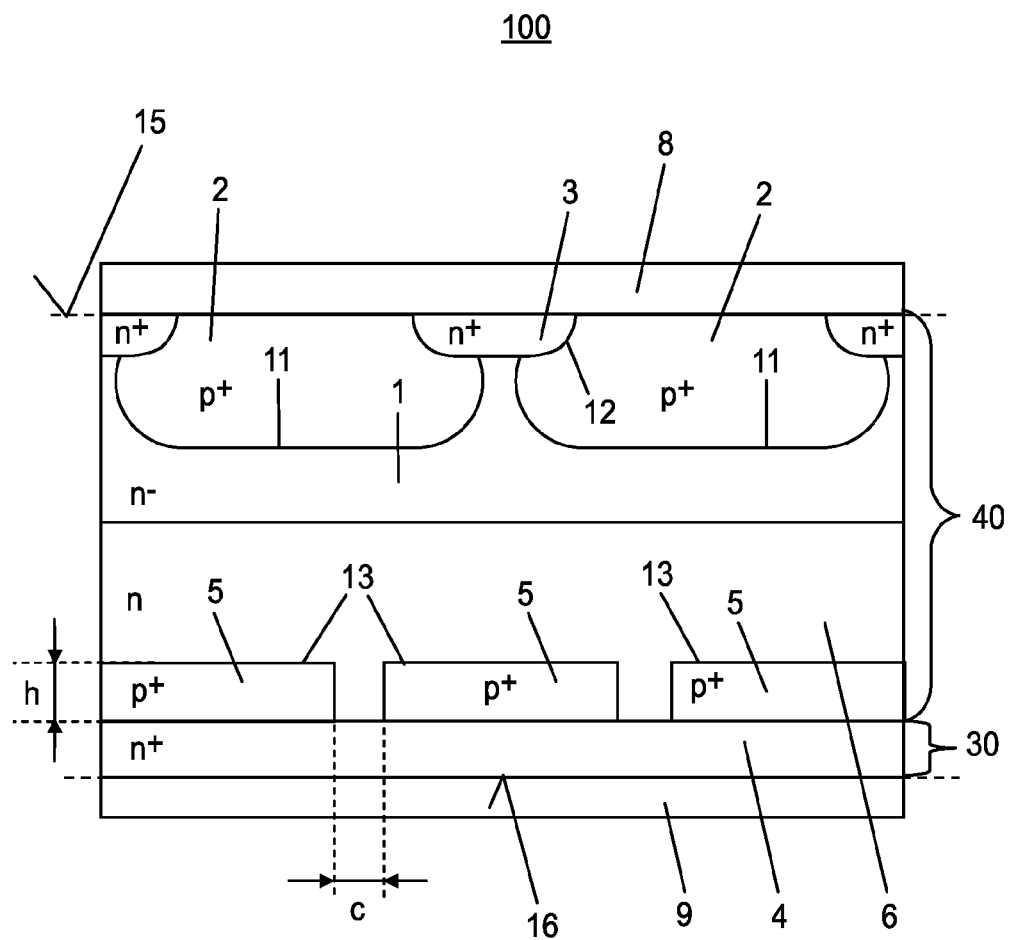
FIG. 9 shows a semiconductor diode in accordance with one embodiment with a CIBH cathode structure.

FIG. 9 shows a semiconductor diode 100 in accordance with one embodiment with a structured cathode emitter in a vertical section. The semiconductor diode 100 in FIG. 9 is similar to the structure shown in FIG. 1, but in addition an n-doped buffer region 6 is arranged between the drift region 1 and the contact region 4, and a plurality of p-doped island zones 5 spaced apart from one another are arranged between the contact region 4 and the buffer region 6. Typically, the maximum dopant concentration of the island zones 5 is in a range of approximately $5*10^{16}$ cm$^{-3}$ to approximately $5*10^{19}$ cm$^{-3}$ and the maximum dopant concentration of the buffer region 6 is in a range between the maximum dopant concentration of the drift region 1 and the maximum dopant concentration of the contact region 4. Under very hard switching conditions, such a cathodal structure can prevent the formation of destructive cathodal filaments through the injection of holes. This cathodal structure is also referred to hereinafter as CIBH structure (Controlled Injection of Backside Holes). In addition, the softness of the recovery process can be improved further by the integration of a CIBH structure.

Typically, for this purpose the horizontal distance c between the island zones 5 is in a range of approximately 1 μm to approximately 3 μm and the area proportion of the island zones 5 in a horizontal sectional plane is between approximately 92% and approximately 98%. Moreover, the vertical extent h of the island zones 5 is typically more than approximately 0.5 μm and less than approximately 3 μm and thus differs from conventional CIBH structures.

Figure 10:
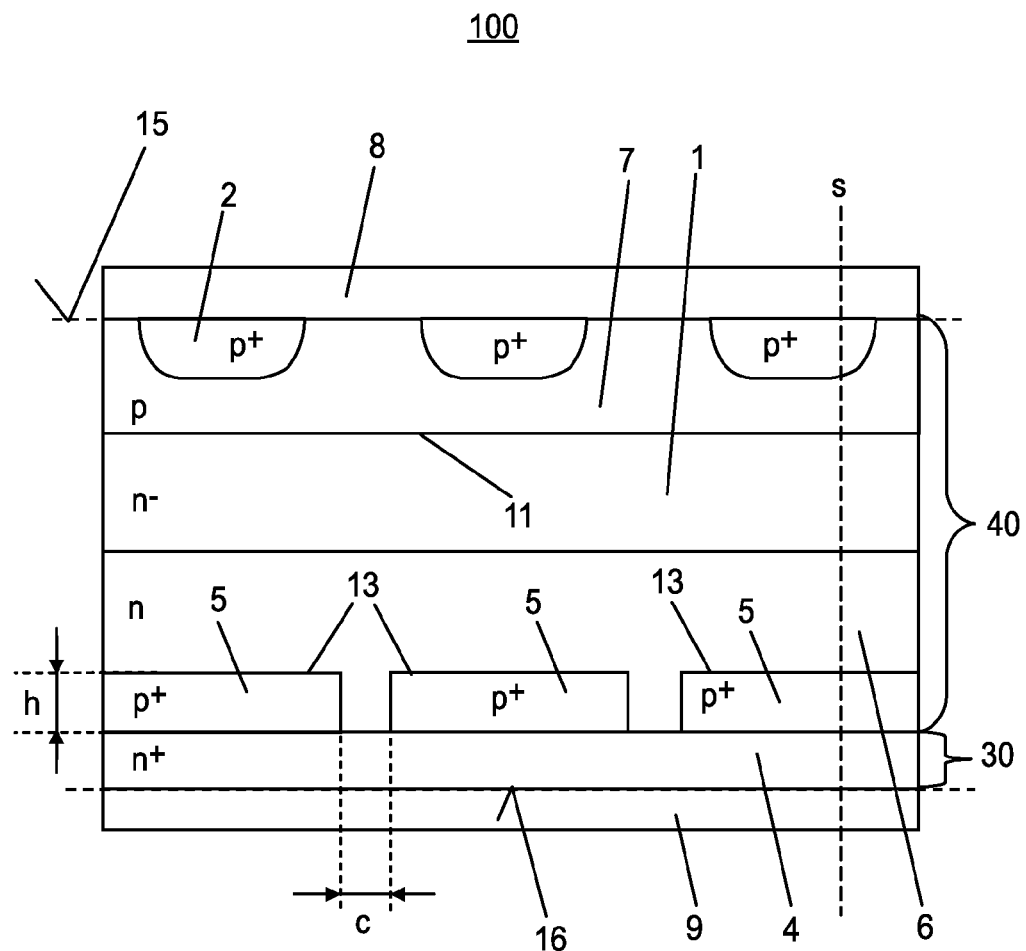
FIG. 10 shows a semiconductor diode in accordance with a further embodiment with a CIBH cathode structure.

FIG. 10 shows a semiconductor diode 100 in accordance with a further embodiment with a CIBH cathode structure in a vertical section. Instead of the n-channel anode structure shown in FIG. 9, the anode emitter shown in FIG. 10 is embodied as in the case of a normal SPEED diode. This means that the anode structure has a continuous p-doped emitter zone 7, into which the anode emitter zones 2 are embedded and which is in electrical contact with the anode metallization 8 and adjoins the drift region 1 and the maximum dopant concentration of which is less than the maximum dopant concentration of the anode emitter zones 2. In the case of this structure, the load pn junction 11 is formed between the emitter zone 7 and the drift region 1. The semiconductor diode 100 shown in FIG. 10 is also distinguished by a high surge current robustness and a soft recovery behavior. The dimensioning and doping of the island zones 5 should typically be chosen in the manner as explained with reference to FIG. 9. The dimensioning of the buffer zone 6 should also typically be chosen similarly for both structures. This will be explained in greater detail by way of example for the semiconductor diode 100 from FIG. 10 with reference to FIG. 11.

Figure 11:
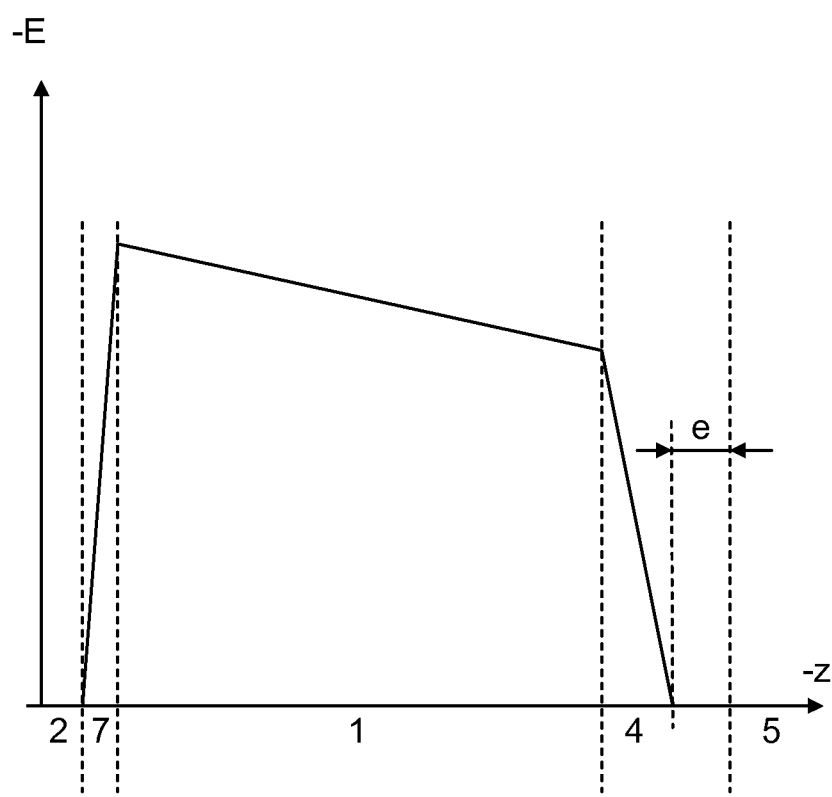
FIG. 11 shows the electric field strength E in the off-state for the semiconductor diode from FIG. 10 in accordance with a further embodiment.

FIG. 11 shows the electric field strength E in the off-state case for the semiconductor diode shown in FIG. 10 along the vertical dashed line s depicted therein. In accordance with a further embodiment, the vertical extent of the buffer zone 6 is dimensioned such that the electric field in the off-state case falls practically completely in a zone between the anode emitter zones 2 and the island zones 5 and does not reach the island zones 5. Typically, the magnitude of the electric field in the off-state case in a range of approximately 1 μm to approximately 30 μm in front of, i.e. above, the island zones 5 is substantially zero, i.e. several orders of magnitude lower than the average field strength. It has surprisingly been found, moreover, that the robustness of a diode with a SPEED structure can also be drastically improved by the cathodal CIBH structure. In the case of the SPEED structure, dynamic avalanche preferably occurs at the p$^+$-doped zones. This promotes the production of current filaments and also of current filaments at the cathode side. For normal SPEED diodes without a cathodal CIBH structure, this is a frequent cause of their destruction. Through the integration of a cathodal CIBH structure, the basic doping can be reduced, moreover, without the maximum possible switching voltage for a soft recovery behavior having to be extensively reduced, as is the case in SPEED diodes without a cathodal CIBH structure. As a result, diodes that are more resistant to cosmic radiation can now also be realized.

Typically, the vertical extent of the buffer zone 6 is in a range of approximately 10 μm to approximately 100 μm.

The common features of the semiconductor diodes shown in FIGS. 9 and 10 can also be summarized as a semiconductor diode having an anode emitter efficiency that is self-controlled in a manner dependent on the current density or current intensity and having a cathodal CIBH structure. In this case, the anode structure that realizes the self-controlled anode emitter efficiency contains an anode metallization 8 and a plurality of mutually spaced apart p-doped anode emitter zones 2 in ohmic contact with the anode metallization 8. The cathodal CIBH structure contains a cathode metallization 9, an n-doped contact region 4 in ohmic contact with the cathode metallization 9, an n-doped buffer region 6, which is electrically connected to the cathode metallization 9 via the n-doped contact region 4 and has a lower maximum dopant concentration than the contact region 4, and also at least two mutually spaced apart p-doped island zones 5 arranged between the contact region 4 and the buffer region 6.

Results of device simulations will now be explained with reference to FIGS. 12 to 15. In this case, the curves designated by c0 correspond to a diode having a continuous p-type emitter and a cathodal CIBH structure, the curves designated by c1 correspond to a reference diode having a continuous p-type emitter without a cathodal CIBH structure, the curves designated by c2 correspond to a SPEED diode without a cathodal CIBH structure, the curves designated by c3 correspond to an n-channel diode without a cathodal CIBH structure (corresponding to the structure shown in FIG. 1), the curves designated by c4 correspond to an n-channel diode having a cathodal CIBH structure (corresponding to the structure shown in FIG. 9) and the curves designated by c5 correspond to a SPEED diode having a cathodal CIBH structure (corresponding to the structure shown in FIG. 10).

Figure 12A:
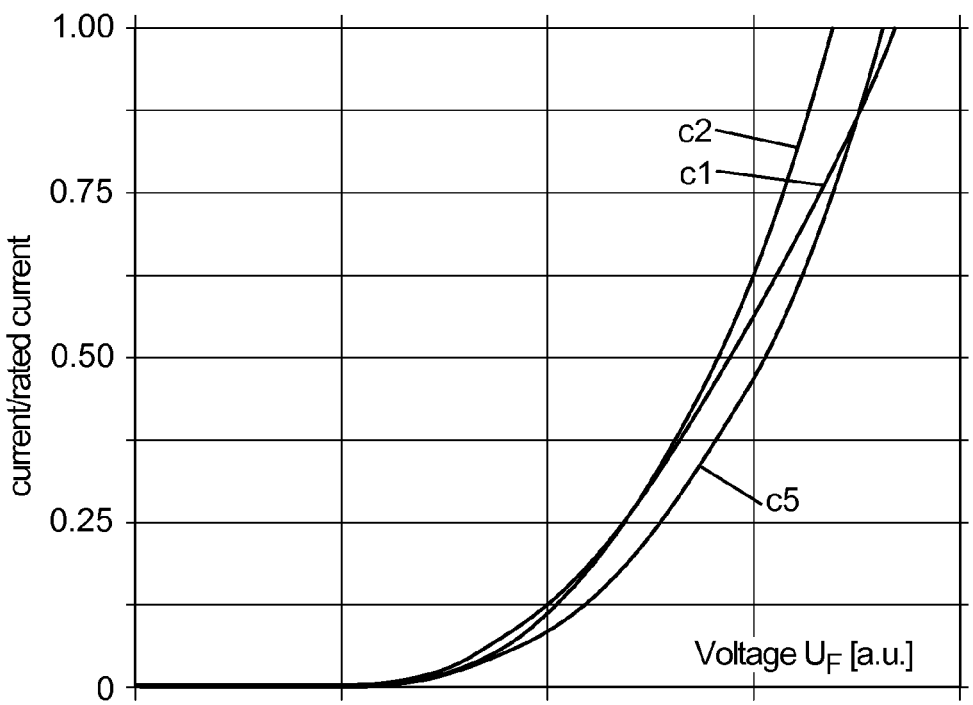
FIG. 12A and FIG. 12B show simulated forward characteristic curves of diodes in comparison with a reference diode.
Figure 12B:
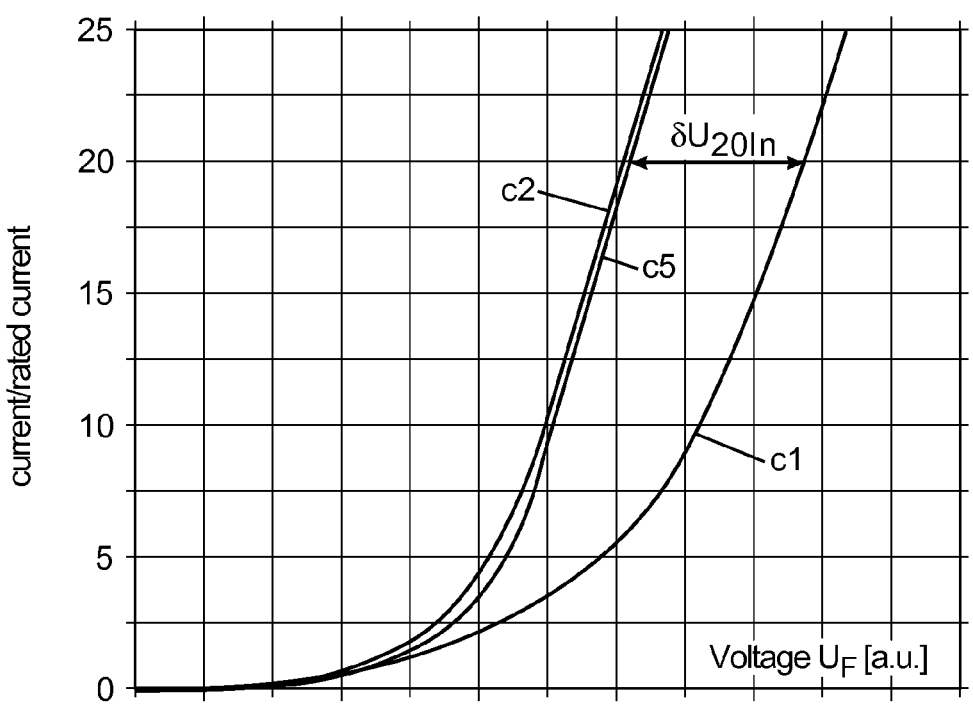
Figure 13A:
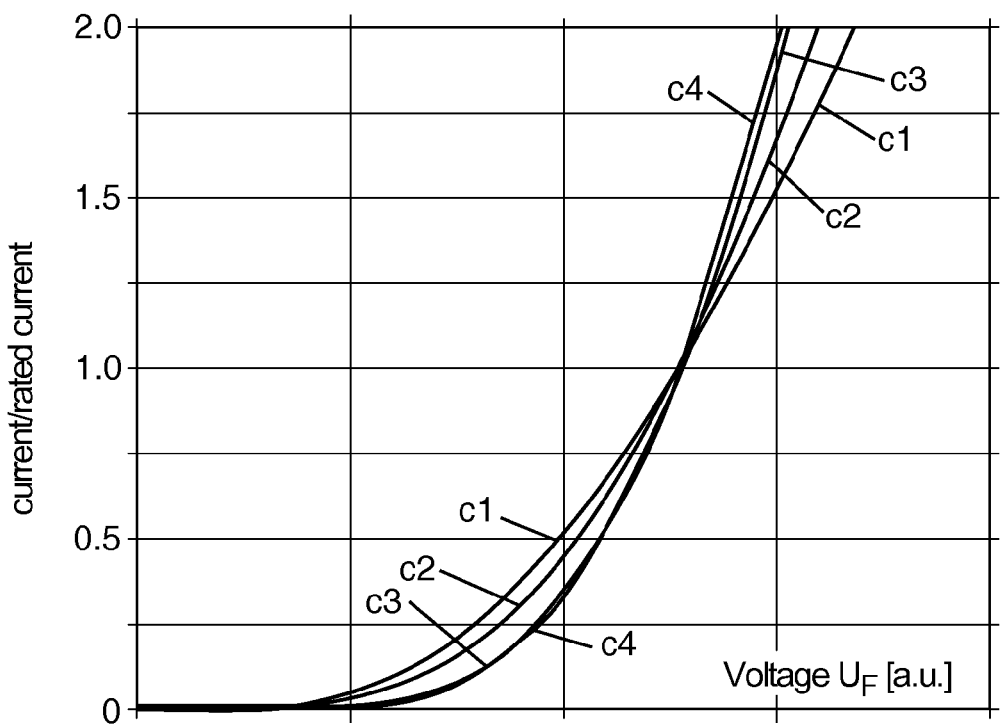
FIG. 13A and FIG. 13B show simulated forward characteristic curves of diodes in comparison with a reference diode.
Figure 13B:
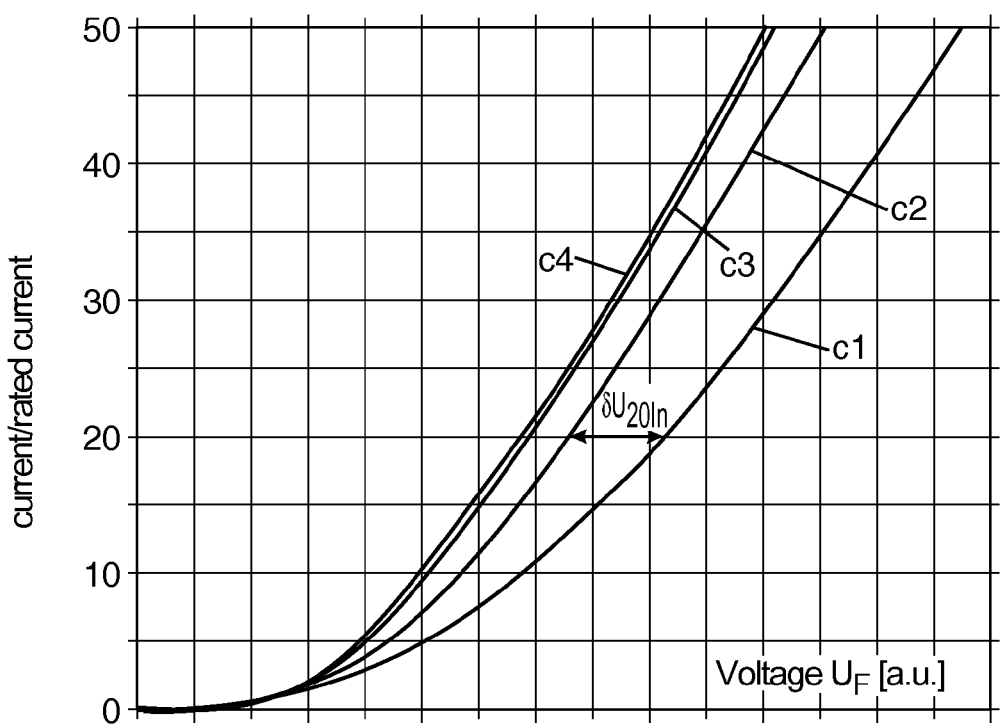

FIGS. 12A and 12B, and also 13A and 13B, show forward characteristic curves (current intensity/rated current intensity as a function of the forward voltage $U_F$) of diodes, wherein FIG. 12A and FIG. 13A in each case show an enlarged excerpt from the respective FIG. 12B and FIG. 13B at small forward voltages $U_F$. In FIGS. 12A and 12B, the SPEED diode having a cathodal CIBH structure (curves c5) is compared with the normal SPEED diode (without a cathodal CIBH structure, curves c2) and the reference diode (curves c1). Typically, the speed diode without a cathodal CIBH structure is optimized such that it exhibits a highest possible surge current robustness, that is to say that e.g. at 20-fold rated current a smallest possible voltage drop $\delta U_{20ln}$ across the diode occurs in comparison with the reference diode. As can be gathered from FIG. 12B, the SPEED diode having a cathodal CIBH structure has a comparably good surge current robustness relative to an optimized normal speed diode.

In FIG. 13A and FIG. 13B, the diode parameters were chosen such that the forward characteristic curves intersect at the rated current $I_n$. Under these conditions, the n-channel diode having a cathodal CIBH structure (curves c4) exhibits the greatest reduction of the voltage drop $\delta U_{20In}$ in comparison with the reference diode, followed by the n-channel diode without a cathodal CIBH structure (curves c3) and the SPEED diode without a cathodal CIBH structure (curve c2).

Figure 14:
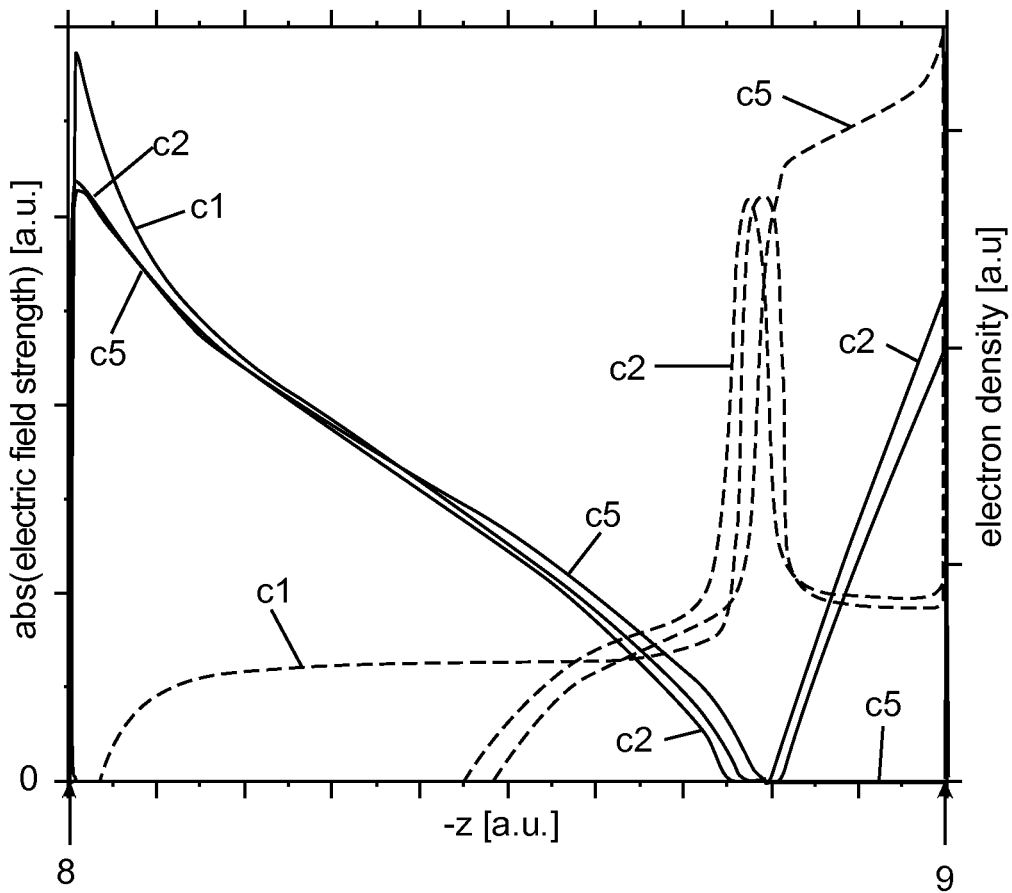
FIG. 14 shows the electric field strength and the electron density of diodes in comparison with a reference diode in accordance with a simulation during turn-off.

FIG. 14 shows the electric field strength (solid lines) and the electron density (dashed lines) of the diodes compared with one another in FIG. 12 with regard to their forward characteristic curve after turn-off and shortly before plasma exhaustion in the reference diode. Ideally, the plasma remains in contact with the cathode during the entire turn-off process, which is the case only for the SPEED diode having a cathodal CIBH structure (curve c5) and for the curve (not shown) for the n-channel diode having a cathodal CIBH structure. Otherwise, a hard recovery behavior can occur when the space charge regions that form on the anode and cathode sides meet one another. Furthermore, filaments can then form in the space charge region that forms on the cathode side, which filaments can cause thermal destruction of the diode. This is prevented or at least greatly reduced by the cathodal CIBH structure.

Figure 15:
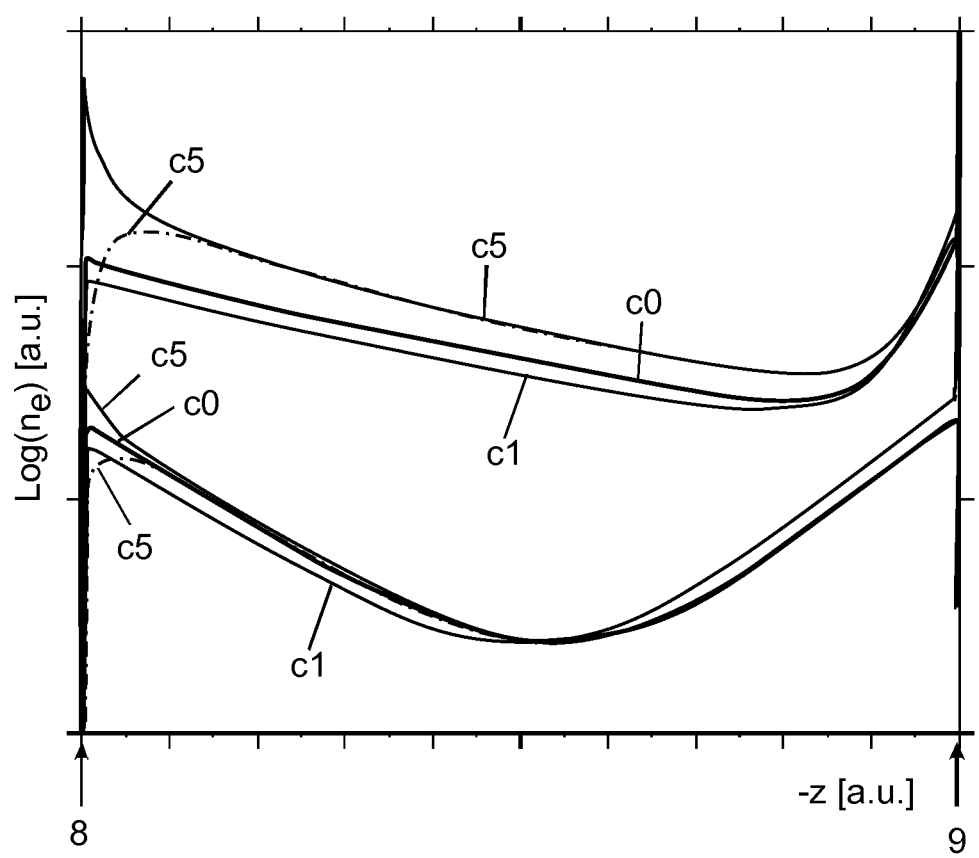
FIG. 15 shows the electron density of diodes in comparison with a reference diode in accordance with a simulation in the on state.

FIG. 15 shows the electron density of the SPEED diode having a cathodal CIBH structure (curves c5) in comparison with the diode having a continuous p-type emitter and a cathodal CIBH structure (curves c0) and the reference diode (curve c1) in accordance with a simulation in the on state at rated current (lower curves) and 20-fold overcurrent (upper curves), wherein the solid and dashed curves for the SPEED diode having a cathodal CIBH structure correspond to a vertical sectional line which respectively does and does not intersect anode emitter zones 2. Whereas at the rated current approximately the same amount of plasma is present and the forward voltage is thus similarly high, the speed diode having a cathodal CIBH structure has a significantly higher plasma concentration in the overcurrent case and therefore an increased robustness relative to the other comparative diodes shown.

Figure 16:
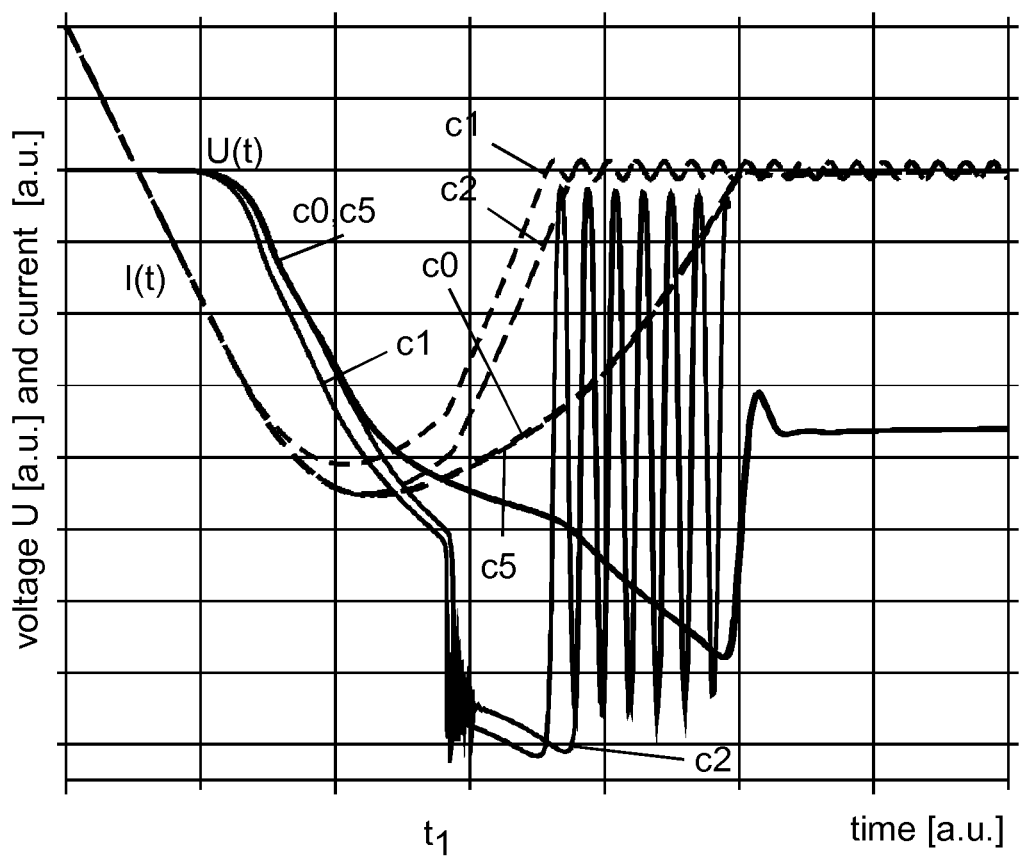
FIG. 16 shows the recovery behavior of diodes in comparison with a reference diode in accordance with a simulation.

FIG. 16 illustrates the dynamic recovery behavior (current and voltage as a function of time) of diodes in comparison with a reference diode in accordance with a simulation. Under the hard switching condition shown (the time segment shown is approximately 5 µs), only the diode having a continuous p-type emitter and a cathodal CIBH structure (curves c0) and the SPEED diode having a cathodal CIBH structure (curve c5), and also the n-channel diode having a CIBH structure, said n-channel not being shown for reasons of clarity, do not oscillate and hence exhibit the desired soft recovery behavior.

Figure 17:
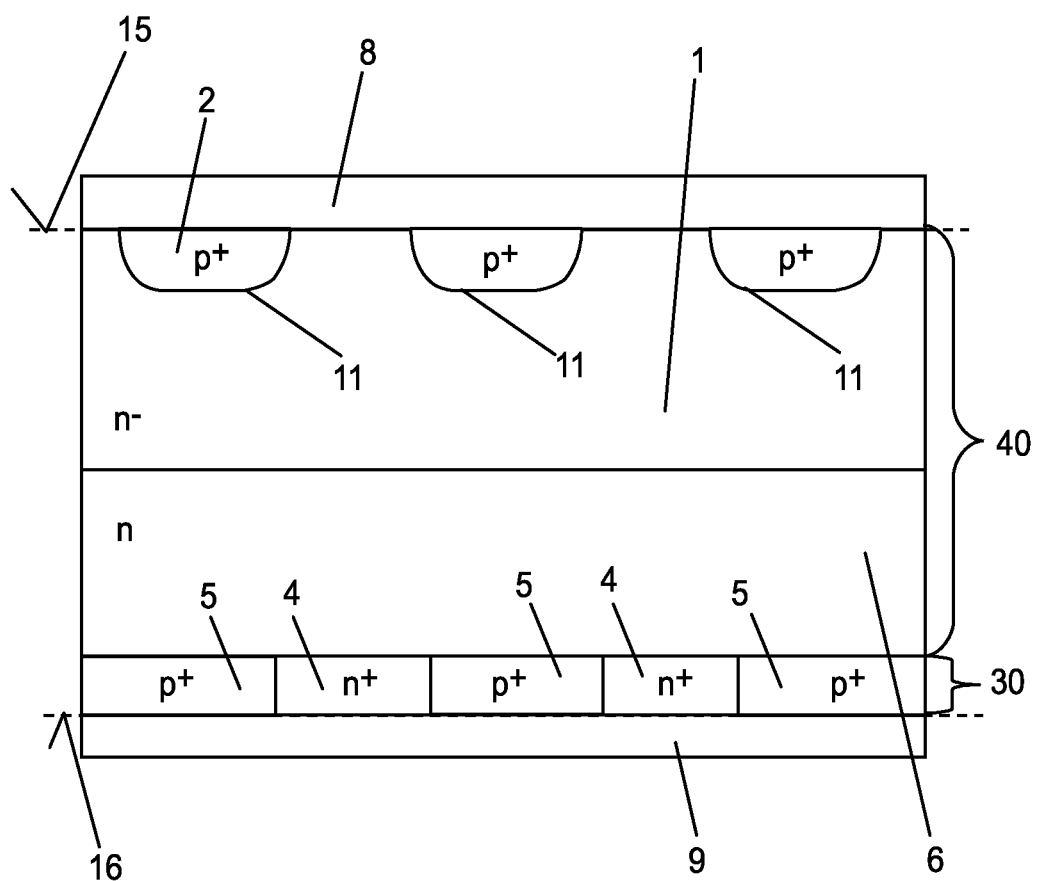
FIG. 17 shows a further embodiment of a bipolar semiconductor component.

FIG. 17 shows a semiconductor diode 100 in a vertical sectional view in accordance with a further embodiment. The semiconductor diode 100 contains an anode structure and a cathode structure. The anode structure contains an anode metallization 8 and a plurality of mutually spaced apart p-doped anode emitter zones 2 in ohmic contact with the anode metallization 8. The cathode structure contains a cathode metallization 9, a plurality of n-doped cathode emitter zones 4 that are in each case spaced apart from one another by p-doped zones 5, wherein the p-doped zones 5 and the cathode emitter zones 4 are in ohmic contact with the cathode metallization 9. The p-doped zones 5 effect control that counteracts current chopping by injecting holes during turn-off. For this purpose, the typically highly doped $p^+$-type zones 5 can also be made shallower than the cathode emitter zones 4. Furthermore, the cathode structure contains an n-doped buffer region 6, which is electrically connected to the cathode metallization 9 via the cathode emitter zones 4 and has a lower maximum dopant concentration than the cathode emitter zones 4, and also a drift region 1 arranged thereabove, which form pn junctions 11 with the anode emitter zones 2.

Production processes for robust bipolar semiconductor components, in particular diodes, having a soft recovery behavior, are explained below.

Figure 18:
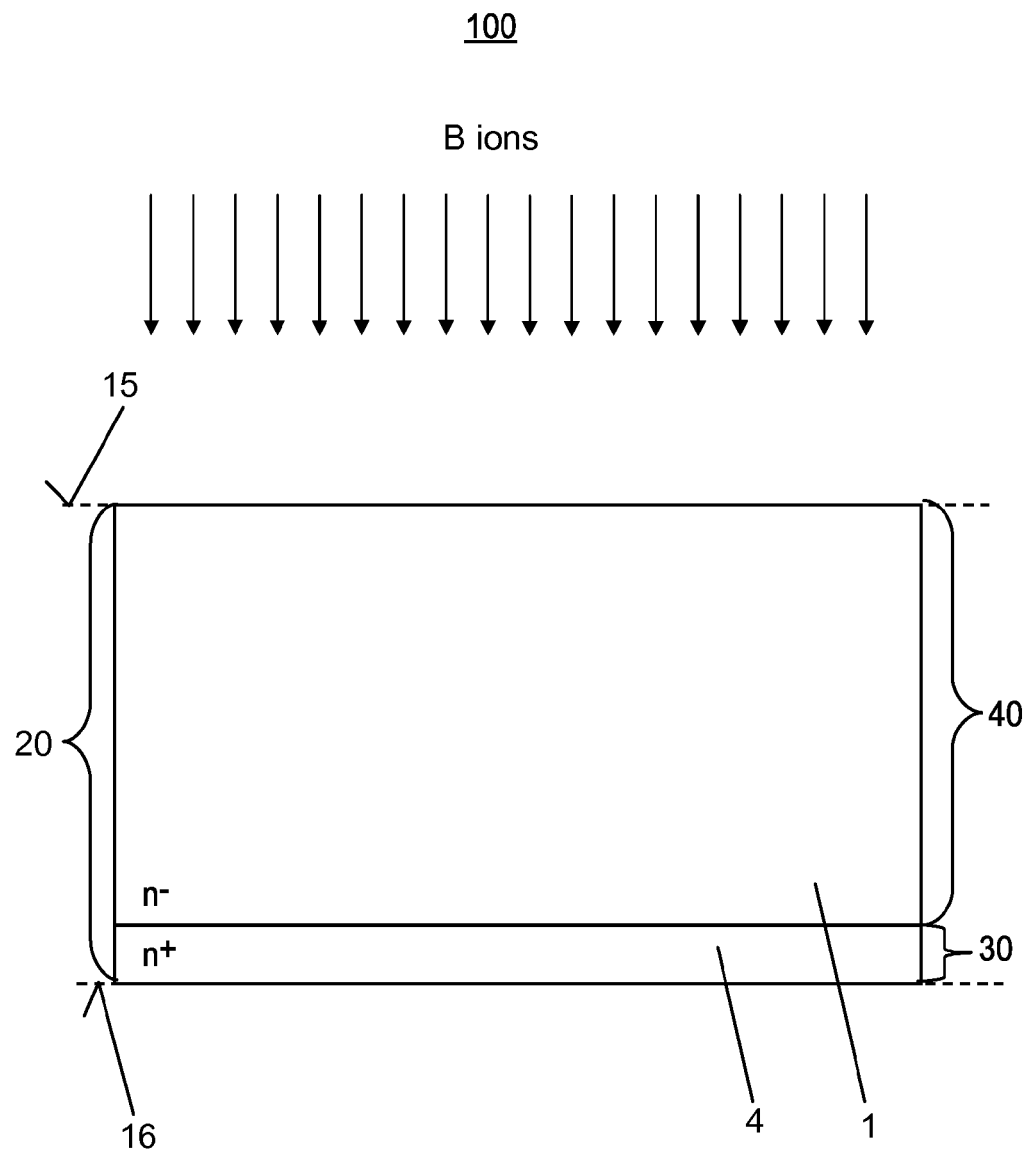
FIGS. 18 to 23 show processes of a production method in accordance with one embodiment.

FIGS. 18 to 23 illustrate, in vertical sectional illustrations, processes of a production method in accordance with one embodiment. In this case, FIG. 18 shows a semiconductor substrate 20 having a weakly n-doped first semiconductor zone 1 extending as far as a first surface 15. Typically, the semiconductor substrate 20 additionally contains an n-doped contact region 4, which extends as far as a second opposite surface 16 and has a higher maximum dopant concentration than the first semiconductor zone 1. The semiconductor substrate 20 can be a monocrystalline substrate. However, it is also possible for the semiconductor substrate 20 to contain a monocrystalline base substrate 30 and at least one epitaxial layer 40 formed thereon. Epitaxial layers often afford greater freedom when setting the background doping of the material, since it is possible to predetermine the doping concentration during the deposition of the epitaxial layer or layers.

Figure 19:
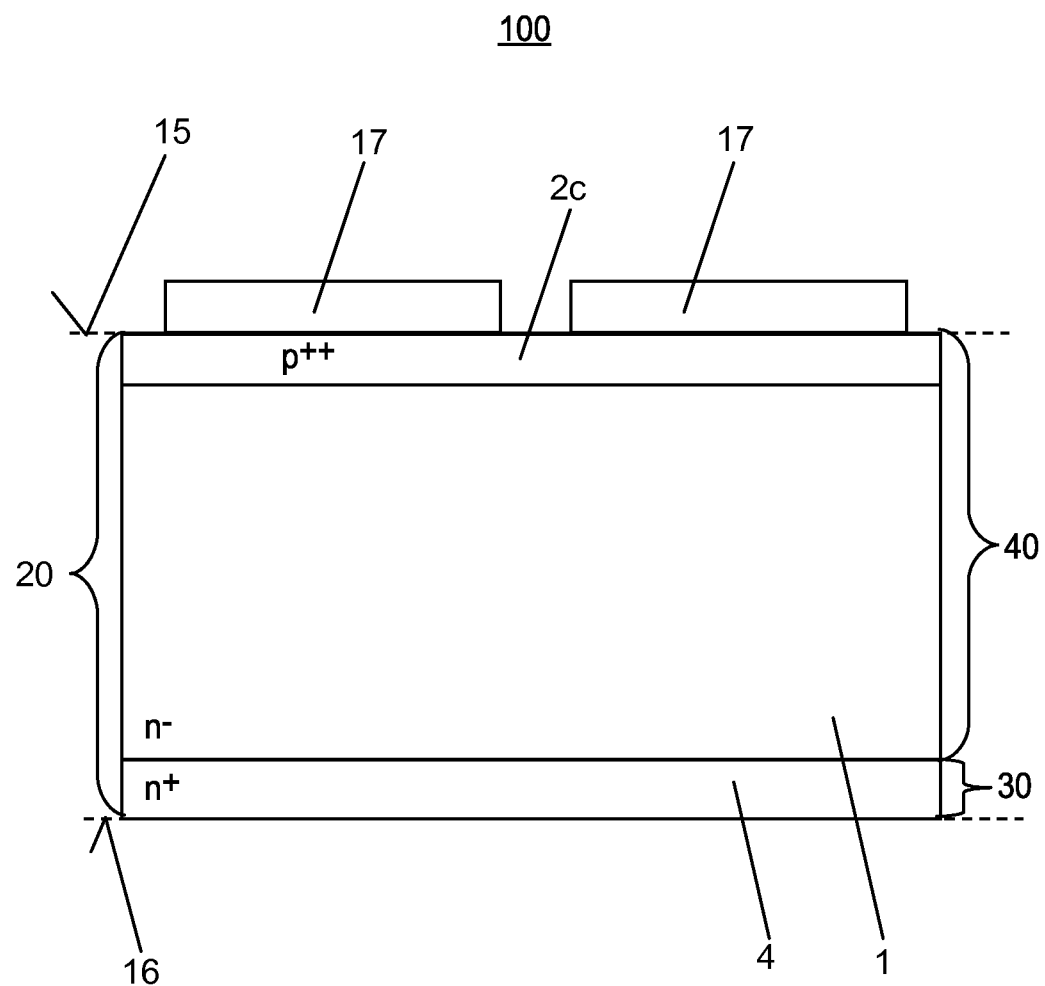
Figure 20:
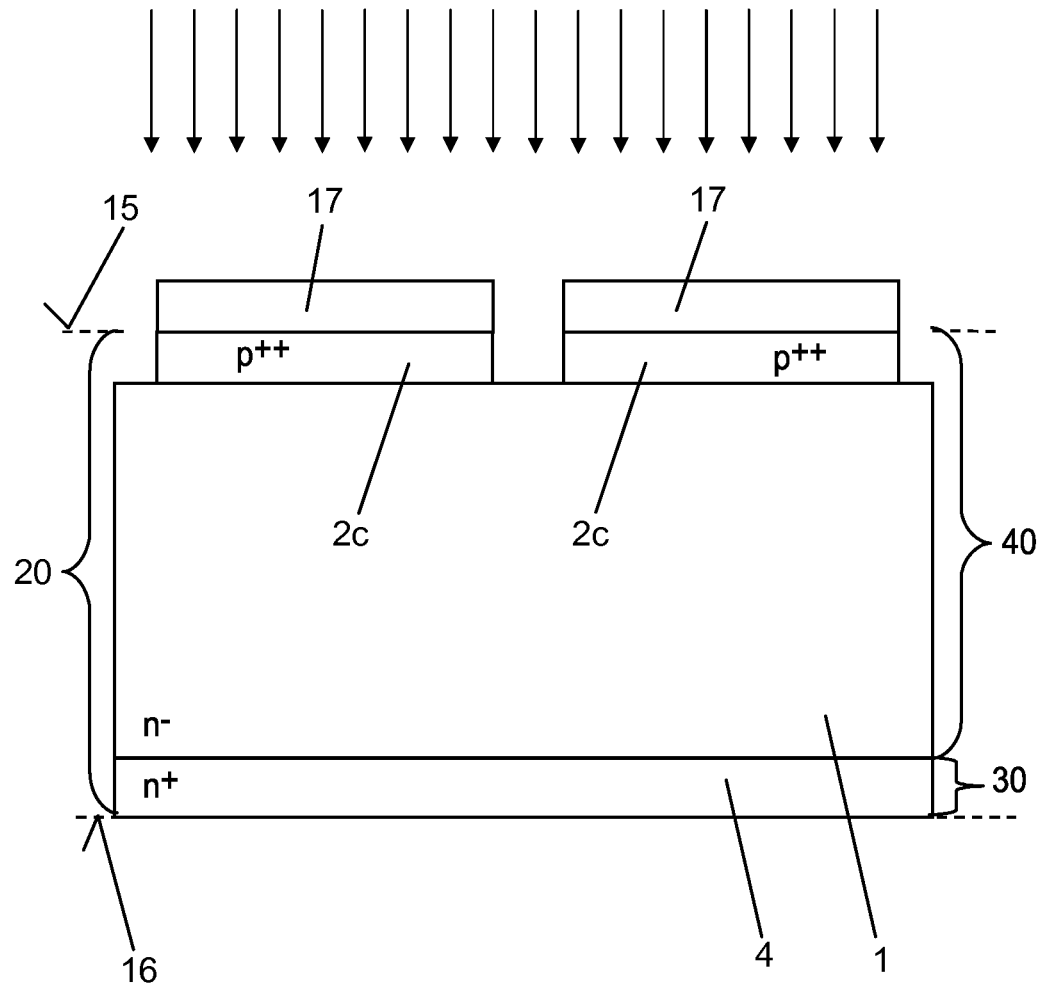
Figure 21:
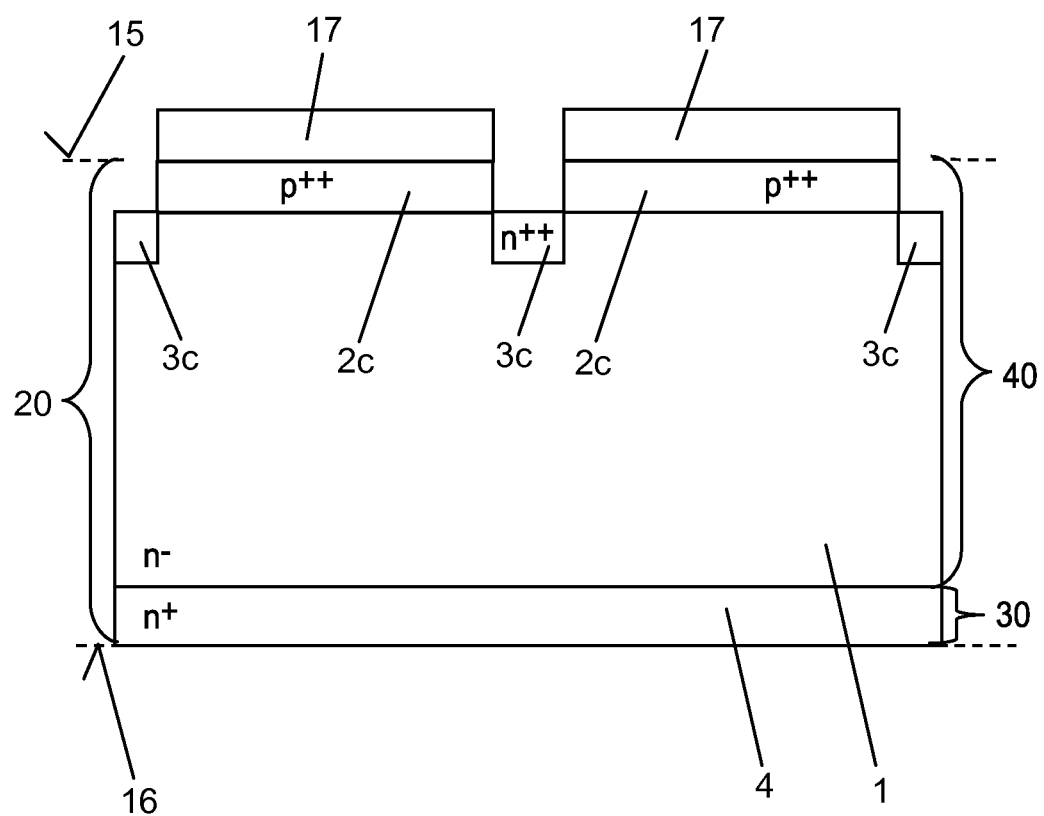
Figure 22:
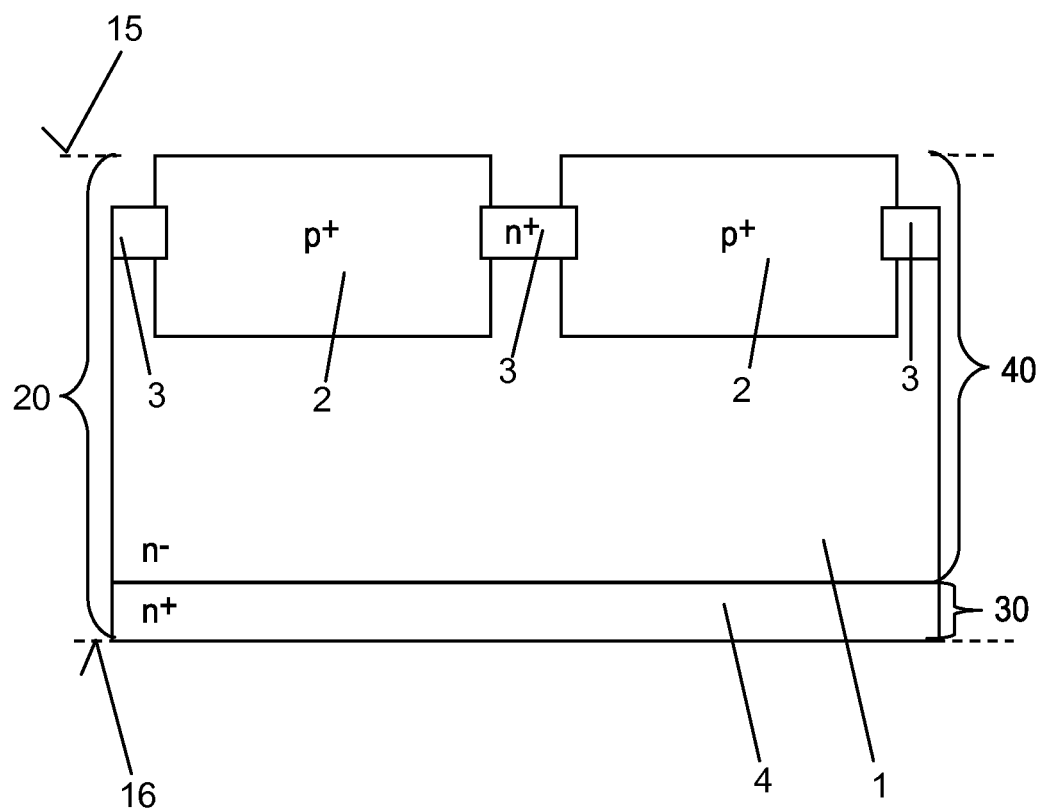
Figure 23:
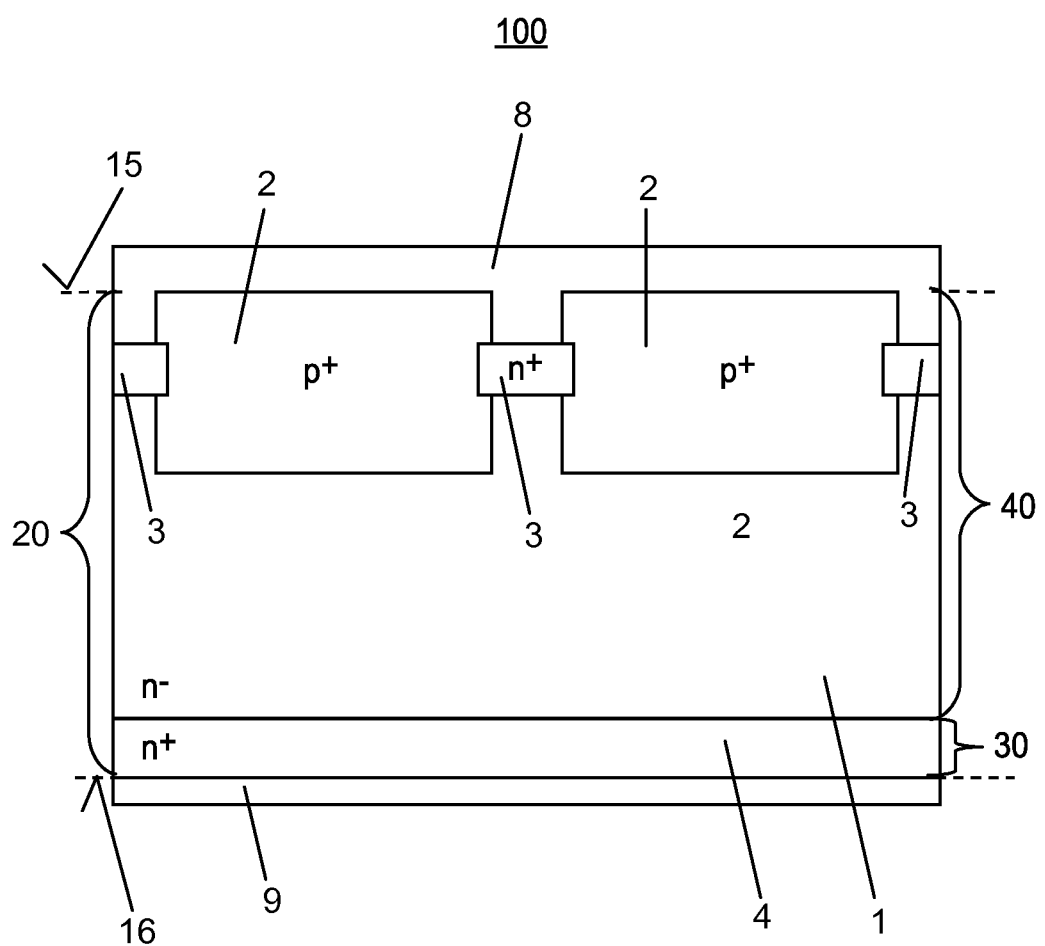

From the first surface 15, acceptor ions, e.g. boron ions, are implanted in whole-area fashion, that is to say in unmasked fashion. As a result, a very heavily p-doped layer 2c is formed below the first surface 15. Afterward, a photopatterned mask 17 is formed on the first surface 15. The resultant semiconductor structure is illustrated in FIG. 19. An anisotropic etching step is then effected, such that the very heavily p-doped layer 2c is divided into a plurality of zones spaced apart from one another horizontally. This is followed by an implantation step with donor ions, e.g. phosphorus, antimony or arsenic ions, through the mask 17, as is shown in FIG. 20. As a result, e.g. in a self-aligned manner, mutually spaced apart very heavily n-doped zones 3c are formed vertically below and horizontally between the zones 2c. This is illustrated in FIG. 21. Afterward, the mask 17 is removed and high-temperature steps for distributing and incorporating the dopants in the depth of and in the semiconductor substrate 20 are carried out. As a result, p-doped second semiconductor regions 2 and n-doped contact zones 3 are shaped, which is illustrated in FIG. 22. If required, the p-doped zones can already be subjected to a thermal drive-in step before the donor implantation is carried out. Afterward, a first metallization 8 or anode metallization 8 is produced on the first surface 15 in electrical contact with the anode emitter zones 2 e.g. by deposition, and a second metallization 9 or cathode metallization 9 is produced on the second surface 15 in electrical contact with the contact region 4 e.g. by deposition. The resultant semiconductor structure 100 is illustrated schematically in FIG. 23. It is similar to the semiconductor structure 100 shown in FIG. 1 and can likewise be operated as a diode. As an alternative, the p-doped zones can also be produced by means of a masked implantation of acceptors and a complementarily masked implantation of donors in combination with suitable drive-in steps.

Figure 24:
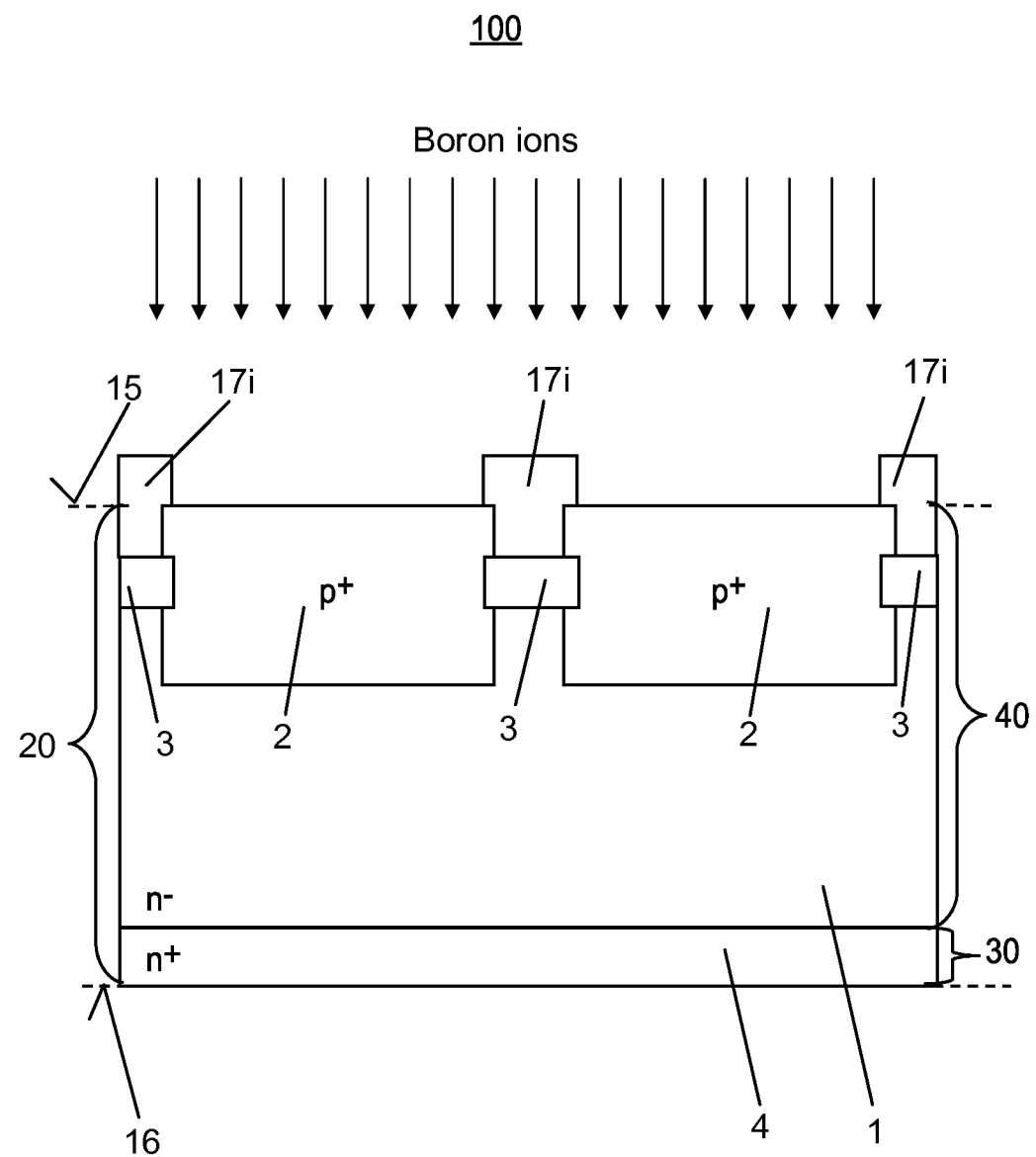
FIGS. 24 to 26 show processes of a production method in accordance with one embodiment.
Figure 25:
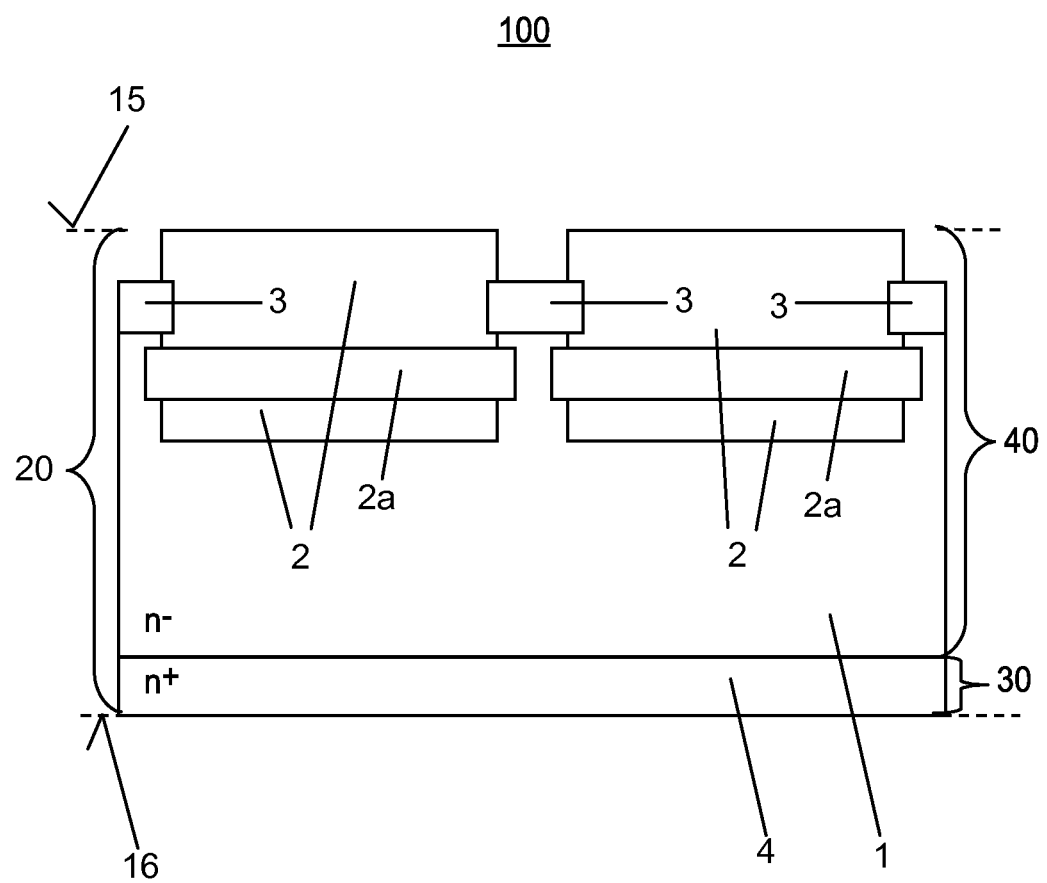
Figure 26:
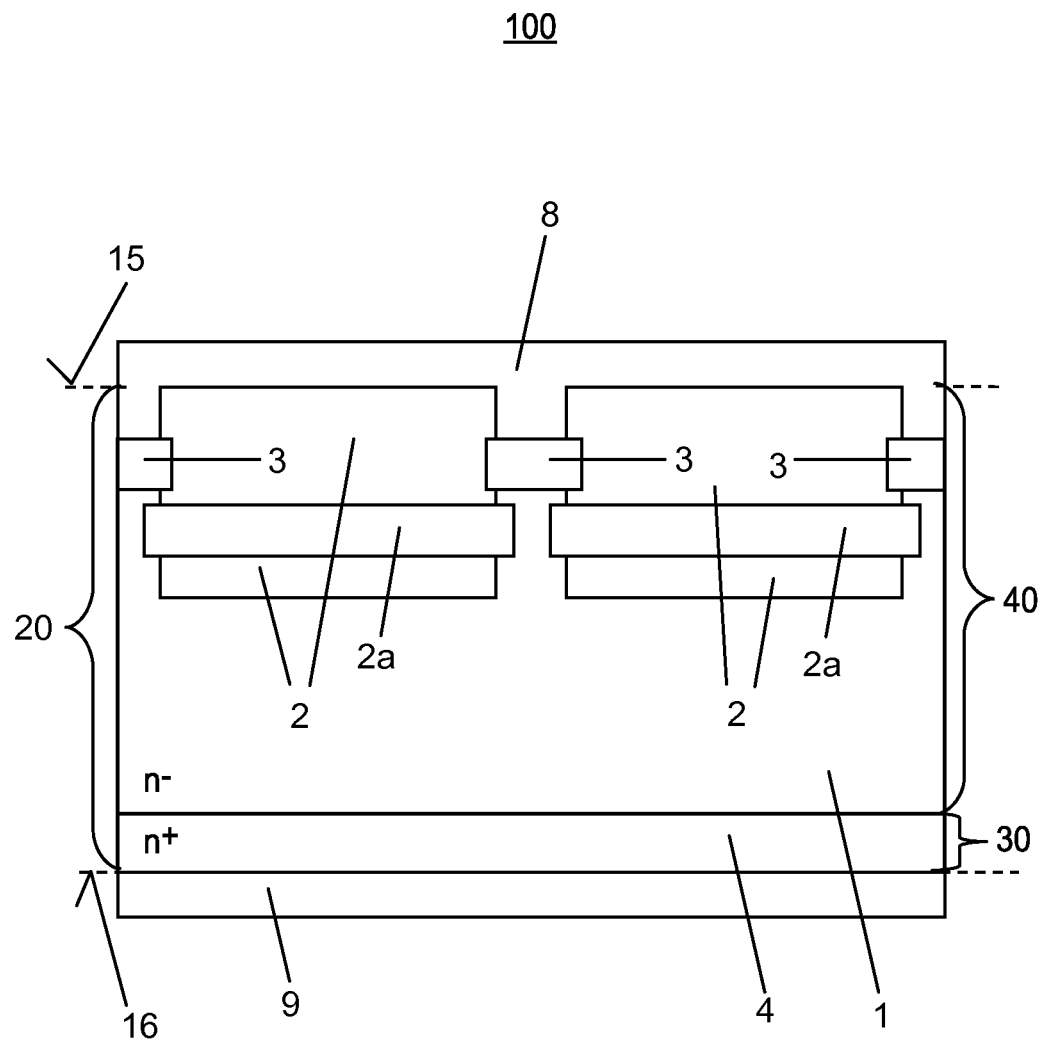

FIGS. 24 to 26 illustrate processes of a production method in accordance with a further embodiment. Proceeding from the semiconductor structure 100 shown in FIG. 22, a further photopatterned mask 17i can be produced on the first surface 15, through which acceptor ions, e.g. boron, gallium or aluminum ions, are implanted. The further mask 17i can correspond e.g. to a substantially inverse mask with respect to the mask 17. This is illustrated in FIG. 24. The doping profile of the second semiconductor zones can thereby be laterally and/or horizontally modified. By way of example, it is thus possible to produce subregions 2a having an increased dopant concentration in the second semiconductor regions 2, as is illustrated in FIG. 25. Afterward, a further thermal treatment step can be effected, and the anode and cathode metallizations can be formed, as previously explained with reference to FIG. 23. The resultant semiconductor structure 100 is illustrated schematically in FIG. 26. It is similar to the semiconductor structure 100 shown in FIG. 3 and can likewise be operated as a diode.

Figure 27:
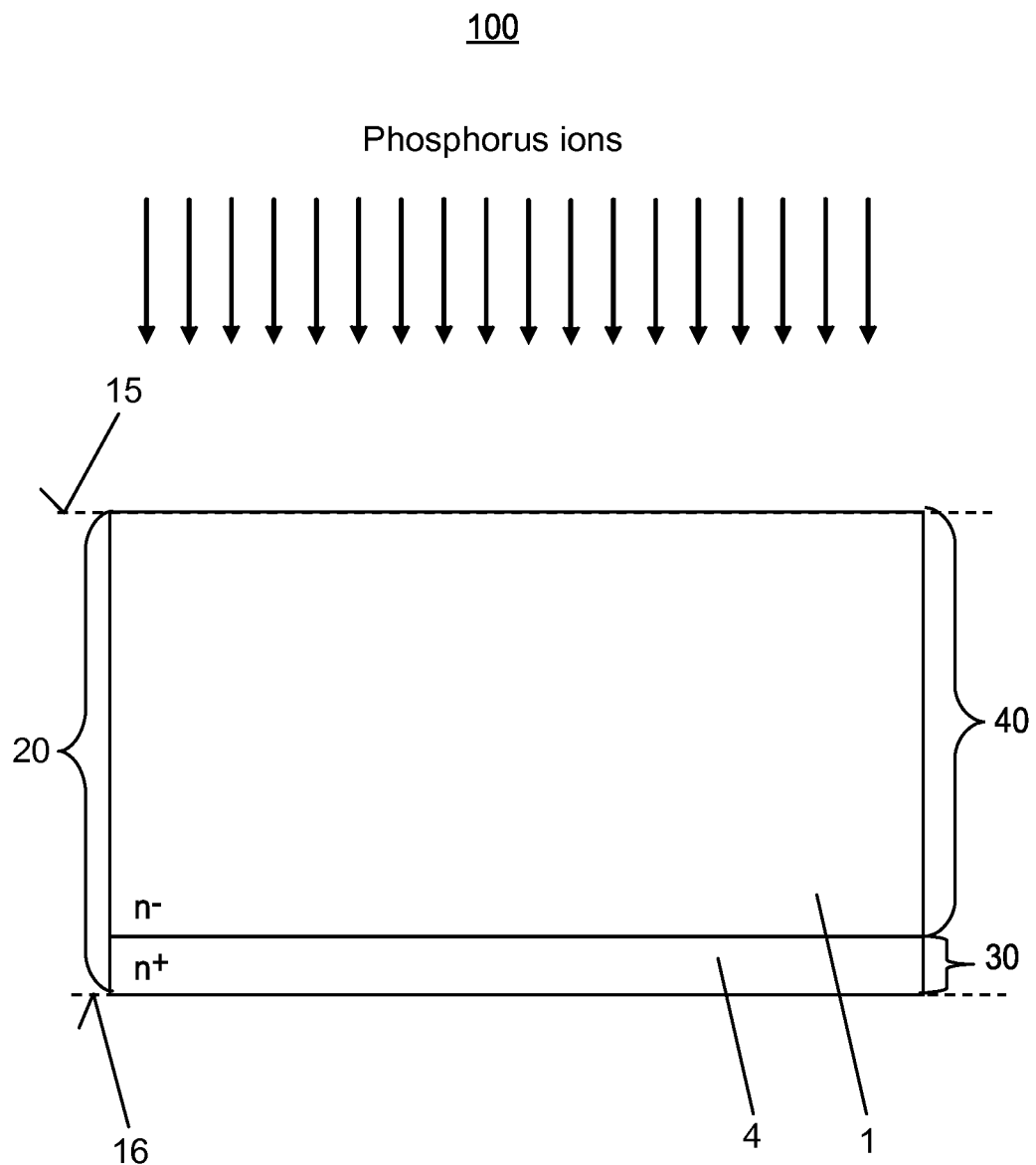
FIGS. 27 to 31 show processes of a production method in accordance with one embodiment.
Figure 28:
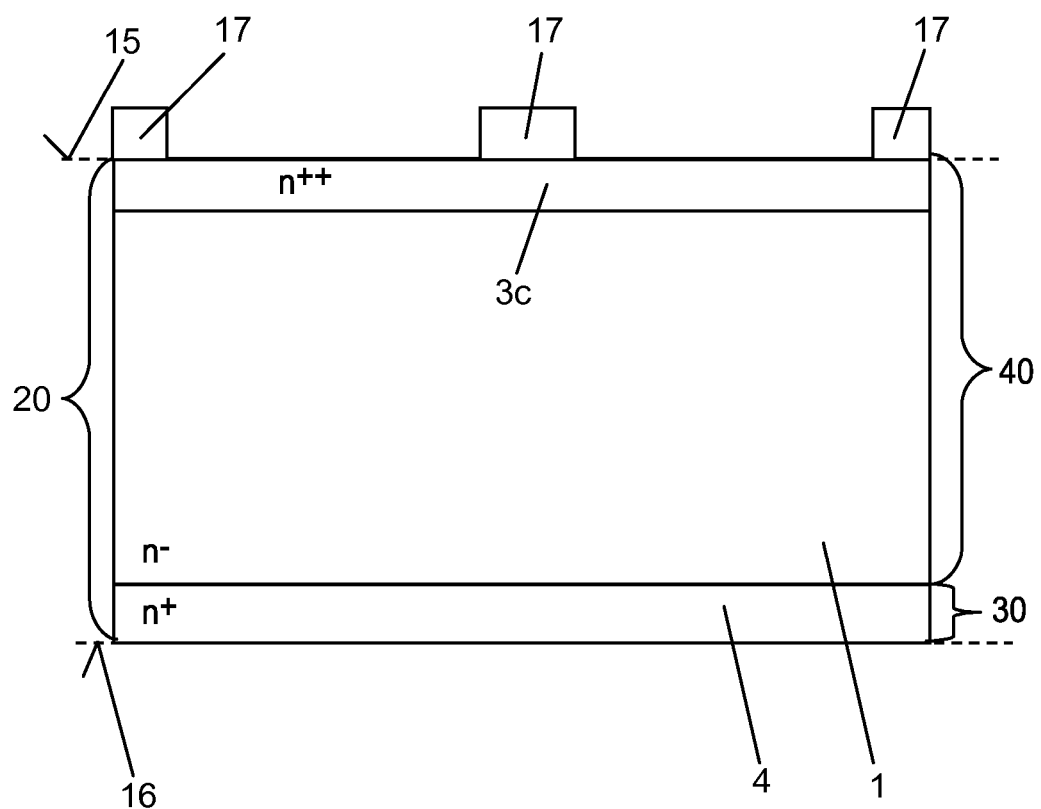
Figure 29:
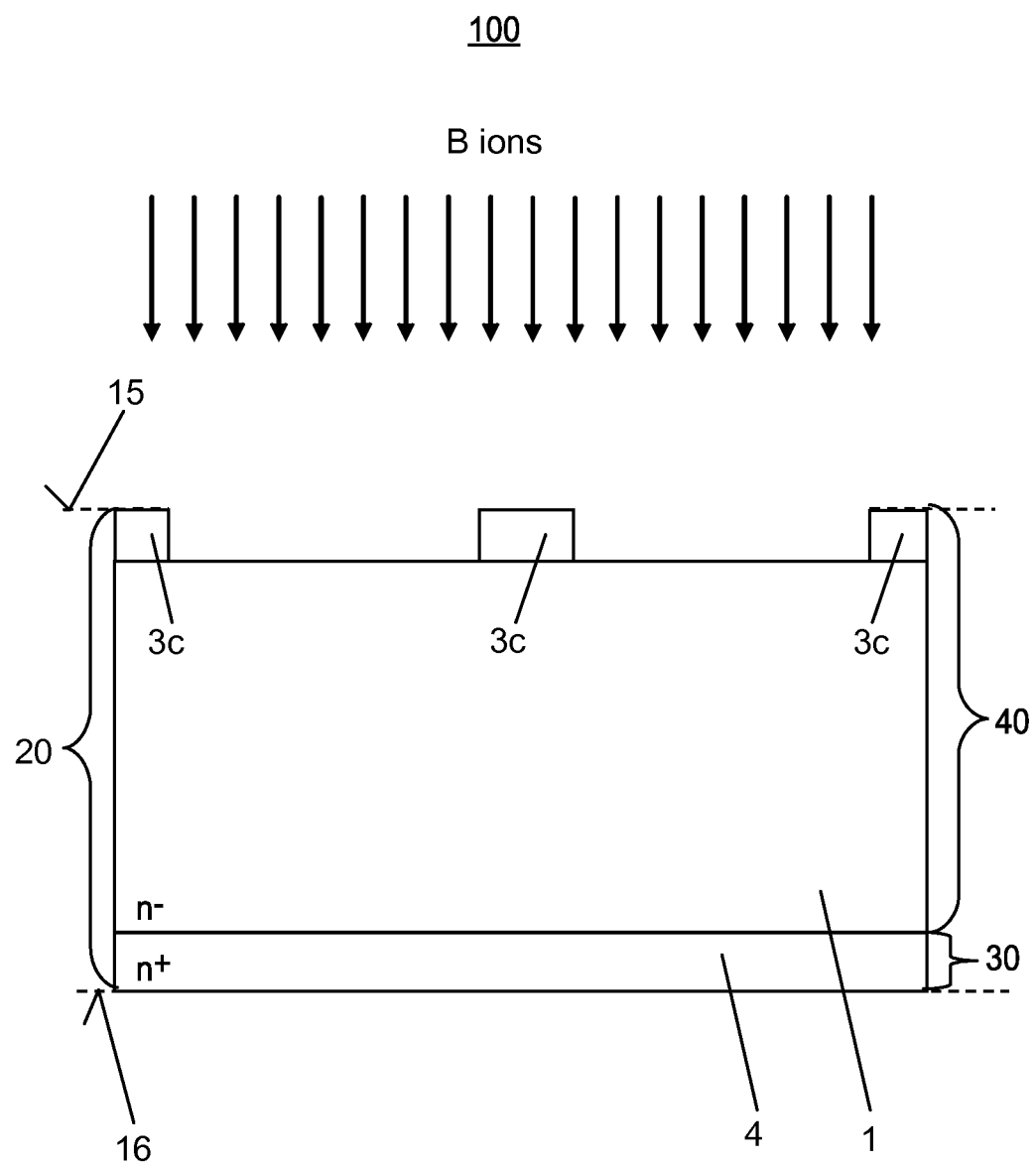
Figure 30:
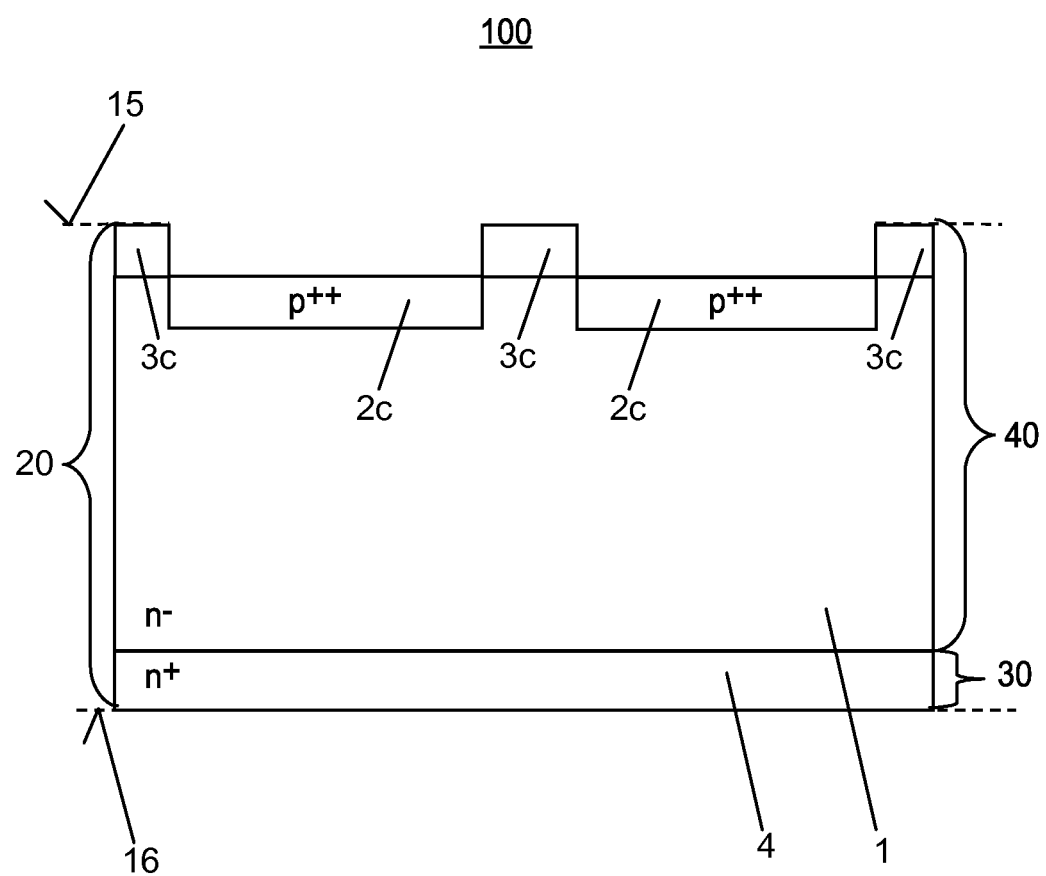
Figure 31:
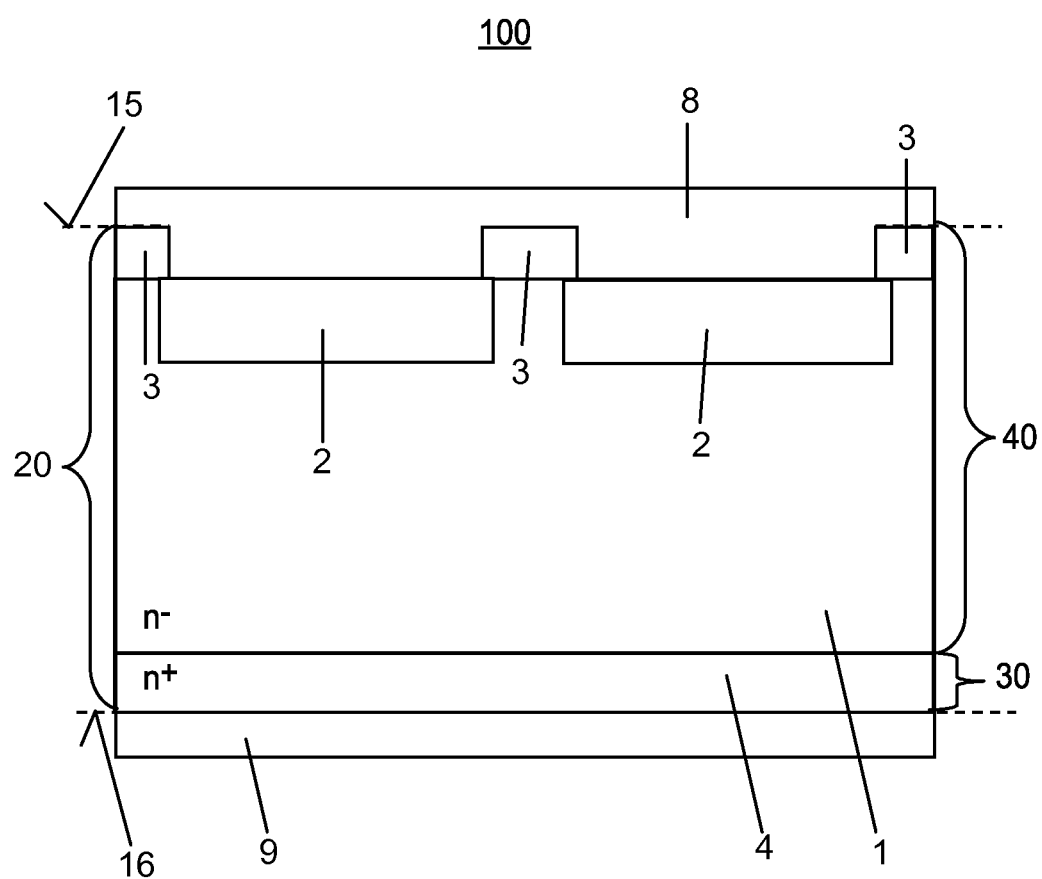

FIGS. 27 to 31 illustrate processes of a production method in accordance with one embodiment. FIG. 27 shows a semiconductor substrate 20 having a weakly n-doped first semiconductor zone 1 extending as far as a first surface 15. Typically, the semiconductor substrate 20 again contains an n-doped contact region 4, which extends as far as a second opposite surface 16 and has a higher maximum dopant concentration than the first semiconductor zone 1. As shown in FIG. 27, donor ions, e.g. phosphorus, antimony or arsenic ions, are then implanted in whole-area fashion through the first surface 15. This leads to the formation of a continuous, very highly doped layer 3c extending from the first surface 15 into the semiconductor substrate 20. A photopatterned mask 17 is then produced on the first surface 15, which is illustrated in FIG. 28. By means of an anisotropic etching step through the mask 17, the layer 3c is divided into zones 3c spaced apart from one another. Afterward, the mask 17 is removed and acceptor ions, e.g. boron (B) ions, are implanted in whole-area fashion from the first surface 15. This is illustrated in FIG. 29. The implantation step with acceptor ions gives rise, as illustrated in FIG. 30, to very heavily p-doped zones 2c spaced apart from one another vertically below and laterally between the spaced-apart zones 3c. High-temperature steps for distributing and incorporating the dopants in the depth and in the semiconductor substrate 20 can then be carried out, and the anode and cathode metallizations can be formed, as has already been explained with reference to FIG. 23. The resultant semiconductor structure 100 is illustrated schematically in FIG. 31. It is similar to the semiconductor structures 100 shown in FIGS. 1 and 23 and can likewise be operated as a diode 100. Optionally, as explained with reference to FIGS. 24 and 25, the doping profile of the second semiconductor zones 2 can be set by means of an additional masked implantation step.

Figure 32:
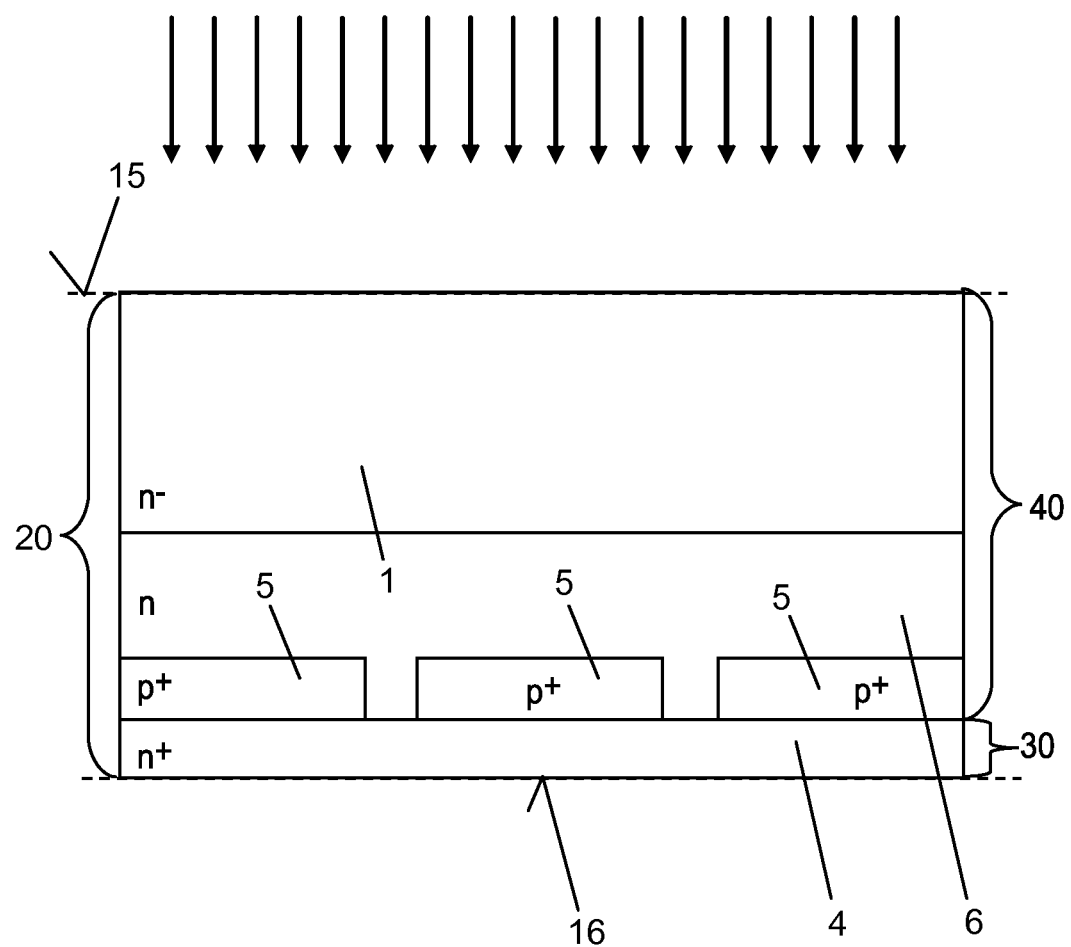
FIG. 32 shows processes of a production method in accordance with a further embodiment.

Further processes of a production method are explained next with reference to FIG. 32. FIG. 32 shows a bipolar semiconductor component 100 having an n-doped first semiconductor zone 1 extending as far as a first surface 15 of the semiconductor substrate 20. The semiconductor component 100 further has an n-doped contact region 4, which extends as far as a second opposite surface 16 of the semiconductor substrate 20 and has a higher maximum dopant concentration than the first semiconductor zone 1. Moreover, the semiconductor substrate 20 contains an n-doped buffer region 6, which is arranged between the first semiconductor zone 1 and the contact region 4 and has a maximum dopant concentration that is higher than the maximum dopant concentration of the first semiconductor zone 1 and lower than the maximum dopant concentration of the contact region 4. Furthermore, the semiconductor substrate 20 contains a plurality of mutually spaced apart p-doped island zones 5 arranged between the contact region 4 and the buffer region 6. Such a structure can be produced by means of suitable epitaxy steps and/or implantation steps. Afterward, a plurality of p-doped anode emitter zones 2 spaced apart from one another are produced from the first surface 15 and an anode metallization 8 is formed on the first surface 15 in electrical contact with the anode emitter zones 2, and a cathode metallization 9 is formed on the second surface 16.

In one embodiment, the anode emitter zones 2 are produced in such a way that they form with the first semiconductor zone 1 pn junctions 11 spaced apart from one another, which leads to a semiconductor component 100 as shown in FIG. 9.

In an alternative embodiment, a continuous p-doped emitter zone 7 is additionally produced in the first semiconductor zone 1 from the first surface 15, which emitter zone extends as far as the first surface 15 and has a maximum dopant concentration that is lower than the maximum dopant concentration of the anode emitter zones 2, and into which emitter zone the anode emitter zones 2 are embedded. This leads to a semiconductor component 100 as shown in FIG. 10.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A bipolar semiconductor component, comprising:
a semiconductor body having a first main surface, a second main surface substantially parallel to the first surface, and at least one load pn junction;
a first metallization on the first surface;
a second metallization on the second surface; and
a current path running in the semiconductor body from the first metallization to the second metallization only through n-doped zones, including between first and second p-doped zones which are in contact with the first metallization and spaced apart from one another by an n-doped channel zone through which the current path runs, and
wherein a space charge region forms in the semiconductor body between the first and second p-doped zones to fully deplete the n-doped channel zone between the first and second p-doped zones and therefore prevent current flow between the first and second metallizations along the current path when a positive voltage is applied between the second metallization and the first metallization.

2. The bipolar semiconductor component of claim 1, wherein the first and second p-doped zones, in a direction running parallel to the first surface, are at a minimum distance d.

3. The bipolar semiconductor component of claim 2, wherein the distance d is less than approximately 1 µm.

4. The bipolar semiconductor component of claim 2, wherein the distance d is less than 10% of a maximum extent L of the first and second p-doped zones, in the direction running parallel to the first surface.

5. The bipolar semiconductor component of claim 1, wherein an area proportion of the first and second p-doped zones in a sectional plane running parallel to the first surface is approximately 90% to 98%.

6. The bipolar semiconductor component of claim 1, wherein a dopant concentration of the first and second p-doped zones has a maximum at the first metallization.

7. The bipolar semiconductor component of claim 1, wherein a dopant concentration of the first and second p-doped zones, in a vertical direction perpendicular to the first surface, has a maximum at a vertical depth corresponding to a horizontal plane parallel to the first surface in which the first and second p-doped zones are at a minimum distance from one another.

8. The bipolar semiconductor component of claim 1, wherein the first and second p-doped zones form a grid.

9. The bipolar semiconductor component of claim 1, wherein a minimal distance between the first and second p-doped zones is at a depth between 30% and 70% of a depth of the first and second p-doped zones.

10. The bipolar semiconductor component of claim 1, wherein in an off state of the bipolar semiconductor component the space charge region does not reach an n-doped contact zone of the bipolar semiconductor component interposed between the first and second p-doped zones above the n-doped channel zone.

11. The bipolar semiconductor component of claim 10, wherein an electric field in the off state is spaced apart from the n-doped contact zone by at least 0.3 microns.

12. The bipolar semiconductor component of claim 1, wherein the current path is connected in parallel with the load pn junction.

13. A semiconductor diode having a dynamic anode emitter efficiency, comprising:
a cathode;
an anode spaced apart from the cathode by a semiconductor body, the anode disposed on a first main surface of the semiconductor body and the cathode disposed on a second main surface of the semiconductor body opposing the first surface;
an anode structure adjacent the anode and formed in the semiconductor body, the anode structure comprising a plurality of p-doped anode emitter zones spaced apart from one another by an n-doped channel zone; and
wherein a space charge region forms in the semiconductor body beginning below a load pn junction formed by the p-doped anode emitter zones to fully deplete the n-doped channel zone between the p-doped anode emitter zones and therefore prevent current flow between the anode and the cathode when a positive voltage is applied between the cathode and the anode.

14. The semiconductor diode of claim 13, wherein the p-doped anode emitter zones have a maximum dopant concentration of more than $5*10^{18}/cm^3$.

15. The semiconductor diode of claim 13, wherein the anode is in contact with the p-doped anode emitter zones and a drift region, which forms load pn junctions with the p-doped anode emitter zones, wherein the n-doped channel zone includes an n-doped contact zone arranged between the anode and in each case two adjacent anode emitter zones and the drift region and has a maximum dopant concentration of more than $5*10^{18}/cm^3$.

16. The semiconductor diode of claim 13, further comprising a cathode structure comprising a cathode metallization, an n-doped contact region in electrical contact with the cathode metallization; an n-doped buffer region electrically connected to the cathode metallization via the contact region and has a lower maximum dopant concentration than the contact region; and at least two p-doped island zones spaced apart from one another and arranged between the contact region and the buffer region and having a maximum dopant concentration of more than $5*10^{16}/cm^3$.

17. The semiconductor diode of claim 13, wherein a dopant concentration of the p-doped anode emitter zones, in a vertical direction perpendicular to the first surface, has a maximum at a vertical depth corresponding to a horizontal plane parallel to the first surface in which the p-doped anode emitter zones are at a minimum distance from one another.

18. A bipolar semiconductor component, comprising:
a semiconductor body having a first main surface and a second main surface parallel to the first surface;
a first metallization on the first surface;
a second metallization on the second surface;
an n-doped first semiconductor region arranged in the semiconductor body, in ohmic contact with the second metallization;
at least two p-doped second semiconductor regions horizontally spaced apart from one another in the semiconductor body, each of the at least two p-doped second semiconductor regions forming a load pn junction with the first semiconductor region;
a current path running in the semiconductor body from the first metallization to the second metallization only through n-doped zones, a first section of the current path running through an n-doped channel zone between two adjacent ones of the p-doped second semiconductor regions; and
wherein a space charge region forms in the semiconductor body to fully deplete the n-doped channel zone between the two adjacent p-doped second semiconductor regions and therefore prevent current flow between the first and second metallizations along the current path when a positive voltage is applied between the second metallization and the first metallization.

19. The bipolar semiconductor component of claim 18, wherein the first section of the current path has a depletable zone delimited horizontally by the two adjacent p-doped second semiconductor regions.

20. The bipolar semiconductor component of claim 18, wherein a dopant concentration of the two adjacent p-doped second semiconductor regions, in a vertical direction perpendicular to the first surface, has a maximum at a vertical depth corresponding to a horizontal plane parallel to the first surface in which the two adjacent p-doped second semiconductor regions are at a minimum distance from one another.

* * * * *